United States Patent
Kang

(10) Patent No.: US 6,906,943 B2
(45) Date of Patent: Jun. 14, 2005

(54) FERROELECTRIC MEMORY DEVICE COMPRISING EXTENDED MEMORY UNIT

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/628,488

(22) Filed: Jul. 29, 2003

(65) Prior Publication Data

US 2004/0114417 A1 Jun. 17, 2004

(30) Foreign Application Priority Data

Dec. 2, 2002 (KR) .............................. 10-2002-0075777

(51) Int. Cl.[7] .............................................. G11C 11/22

(52) U.S. Cl. .................................. 365/145; 365/230.03

(58) Field of Search ............................. 365/145, 230.03

(56) References Cited

U.S. PATENT DOCUMENTS 6,215,692 B1 * 4/2001 Kang ........................ 365/145

* cited by examiner

Primary Examiner—M. Tran
(74) Attorney, Agent, or Firm—Heller Ehrman LLP

(57) ABSTRACT

A ferroelectric memory device including an extended memory unit features a cell array block, a data bus unit, an input/output circuit unit, an extended memory unit and an extended memory controller. The cell array block includes a main bitline and a plurality of sub bitlines. The main bitline is connected between a main bitline pull-up controller and a column selection controller, and each sub bitline is connected to the main bitline and a unit cell. The data bus unit is connected to the column selection controller. The input/output circuit unit includes a sense amplifier array connected to the data bus unit. The extended memory unit shares the main bitline included in the cell array block and includes a plurality of cell blocks. The extended memory controller controls the extended memory unit in response to an external control signal.

19 Claims, 29 Drawing Sheets

FERROELECTRIC MEMORY DEVICE COMPRISING EXTENDED MEMORY UNIT

BACKGROUND OF THE INVENTION

1. Field of the Invention

The present invention relates to a ferroelectric memory device, and more specifically, to a ferroelectric memory device including an extended memory unit to store additional information such as device information.

2. Description of the Prior Art

Generally, a ferroelectric random access memory (hereinafter, referred to as 'FRAM') has attracted considerable attention as next generation memory device because it has a data processing speed as fast as a DRAM (Dynamic Random Access Memory) and conserves data even after the power is turned off.

The FRAM includes capacitors similar to the DRAM, but the capacitors have a ferroelectric substance for utilizing the characteristic of a high residual polarization of the ferroelectric substance in which data is not low even after eliminating an electric field applied thereto.

FIG. 1 is a characteristic curve illustrating a hysteresis loop of a general ferroelectric substance. As shown in FIG. 1, a polarization induced by an electric field does not vanish but keeps some strength ('d' or 'a' state) even after the electric field is cleared due to existence of a residual (or spontaneous) polarization. These 'd' and 'a' states may be assigned to binary values of '1' and '0' for use as a memory cell.

FIG. 2 is a structural diagram illustrating a unit cell of the FRAM device. As shown in FIG. 2, the unit cell of the conventional FRAM is provided with a bitline BL arranged in one direction and a wordline WL arranged in another direction vertical to the bitline BL. A plateline PL is arranged parallel to the wordline and spaced at a predetermined interval. The unit cell is also provided with a transistor T1 having a gate connected to an adjacent wordline WL and a source connected to an adjacent bitline BL, and a ferroelectric capacitor FC1 having the first terminal of the two terminals connected to the drain terminal of the transistor T1 and the second terminal of the two terminals connected to the plateline PL.

FIG. 3a is a timing diagram illustrating a write mode of the conventional FRAM.

Referring to FIG. 3a, when a chip enable signal CSBpad applied externally transits from a high to low level and simultaneously a write enable signal WEBpad also transits from a high to low level, the array is enabled to start a write mode. Thereafter, when an address is decoded in a write mode, a pulse applied to a corresponding wordline transits from a "low" to "high" level, thereby selecting the cell.

In order to write a binary logic value "1" in the selected cell, a "high" signal is applied to a bitline BL while a "low" signal is applied to a plateline PL. In order to write a binary logic value "0" in the cell, a "low" signal is applied to a bitline BL while a "high" signal is applied to a plateline PL.

FIG. 3b is a timing diagram illustrating a read mode of the conventional FRAM. Referring to FIG. 3b, when a chip enable signal CSBpad externally transits from a "high" to "low" level, all bitlines are equalized to a "low" level by an equalization signal before selection of a required wordline.

After each bitline is deactivated, an address is decoded to transit a signal on the required wordline from a "low" to "high" level, thereby selecting a corresponding unit cell. A "high" signal is applied to a plateline of the selected cell to cancel a data Qs corresponding to the logic value "1" stored in the FRAM. If the logic value "0" is stored in the FRAM, a corresponding data Qns will not be destroyed.

The destroyed and non-destroyed data output different values, respectively, according to the above-described hysteresis loop characteristics. As a result, a sense amplifier senses logic values "1" or "0". In other words, as shown in the hysteresis loop of FIG. 1, the state moves from 'd' to 'f' when the data is destroyed while the state moves from 'a' to 'f' when the data is not destroyed.

As a result, the destroyed data amplified by the enabled sense amplifier outputs a logic value "1" while the non-destroyed data amplified by the sense amplifier outputs a logic value "0". The original data is destroyed after the sense amplifier amplifies the data. Accordingly, when a "high" signal is applied to the required wordline, the plateline is disabled from "high" to "low", thereby recovering the original data.

The conventional ferroelectric memory device does not comprise an extended memory unit in the memory device to store information such as device ID, manufacturer code and security code. As a result, an additional memory unit to store the additional information is required outside of the memory.

In the systems using a conventional ferroelectric memory device, there is installed an Error Correcting Circuit (ECC) to repair a fail cell of the memory device in an external system of the memory. Therefore, the system requires to perform an error-correcting operation on fail cells, thereby degrading the operation performance.

SUMMARY OF THE INVENTION

Accordingly, it is an object of the present invention to provide a ferroelectric memory device including an extended memory unit therein. In an embodiment, the extended memory unit is configured to have the same structure as that of a main cell array block. As a result, a conventional control circuit may be used for controlling the extended memory unit, and an additional control circuit is required only for a special function, and the layout of a chip does not increase so much.

In an embodiment, the ferroelectric memory device comprises an ECC (Error Correcting Circuit) controller therein. The ECC controller performs a repair operation on fail cells in cooperation with the extended memory unit.

In an embodiment, there is provided a ferroelectric memory device including an extended memory unit comprising a cell array block, a data bus unit, an input/output circuit unit, an extended memory unit and an extended memory controller. The cell array block includes a main bitline and a plurality of sub bitlines. The main bitline is connected between a main bitline pull-up controller and a column selection controller, and each sub bitline is connected to the main bitline and a plurality of unit cells. The data bus unit is connected to the column selection controller. The input/output circuit unit includes a sense amplifier array connected to the data bus unit. The extended memory unit shares the main bitline included in the cell array block and includes a plurality of cell blocks. The extended memory controller controls the extended memory unit in response to an external control signal.

BRIEF DESCRIPTION OF THE DRAWINGS

FIGS. 8a and 8b are timing diagrams illustrating read/write operations of the sub cell block of FIG. 7a.

DETAILED DESCRIPTION OF THE PREFERRED EMBODIMENTS

The present invention will be described in detail with reference to the attached drawings.

Figure 1:
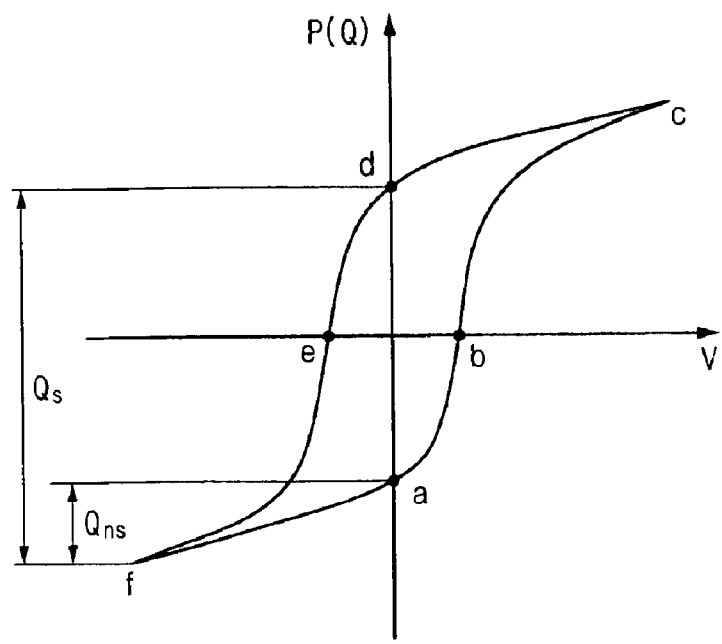
FIG. 1 is a characteristic curve illustrating a hysteresis loop of a general ferroelectric substance.
Figure 2:
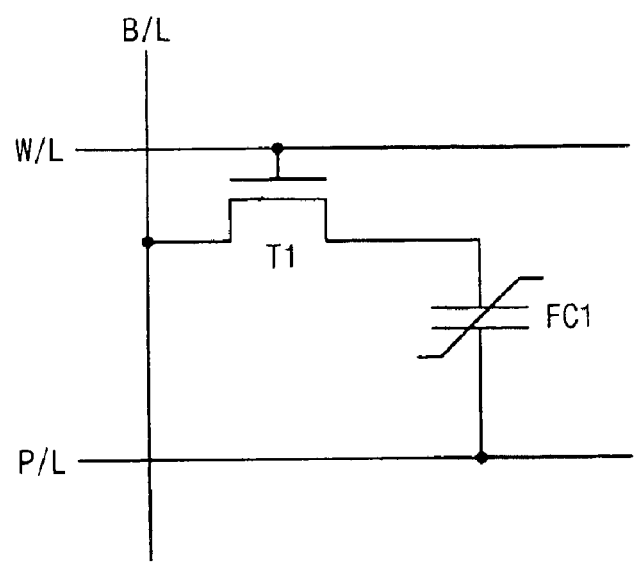
FIG. 2 is a structural diagram illustrating a conventional FRAM cell.
Figure 3A:
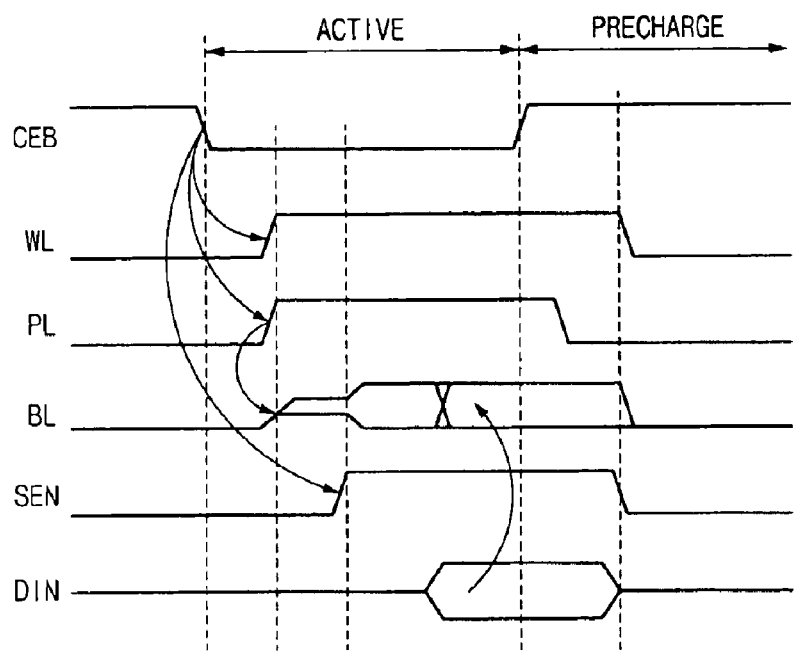
FIGS. 3a and 3b are timing diagrams illustrating read and write operations of a conventional FRAM cell.
Figure 3B:
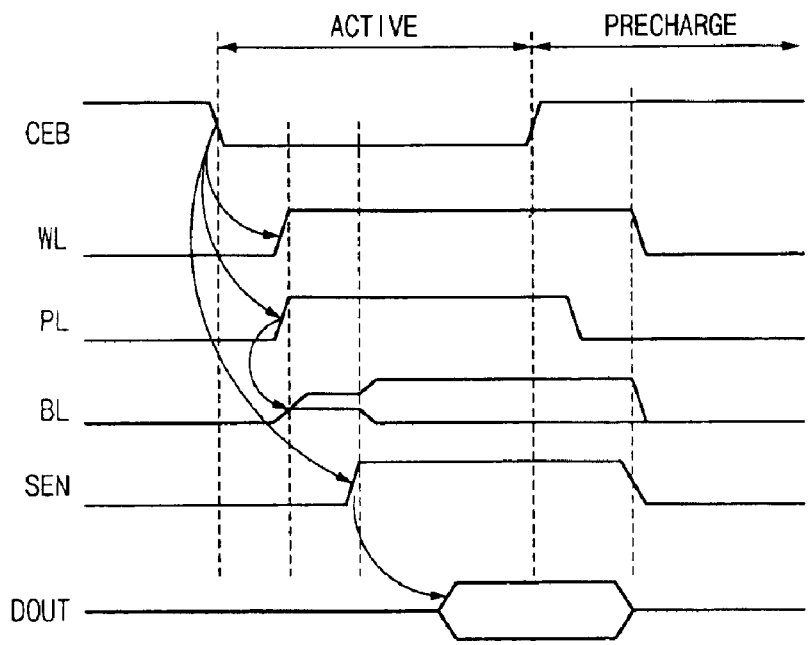
Figure 4:
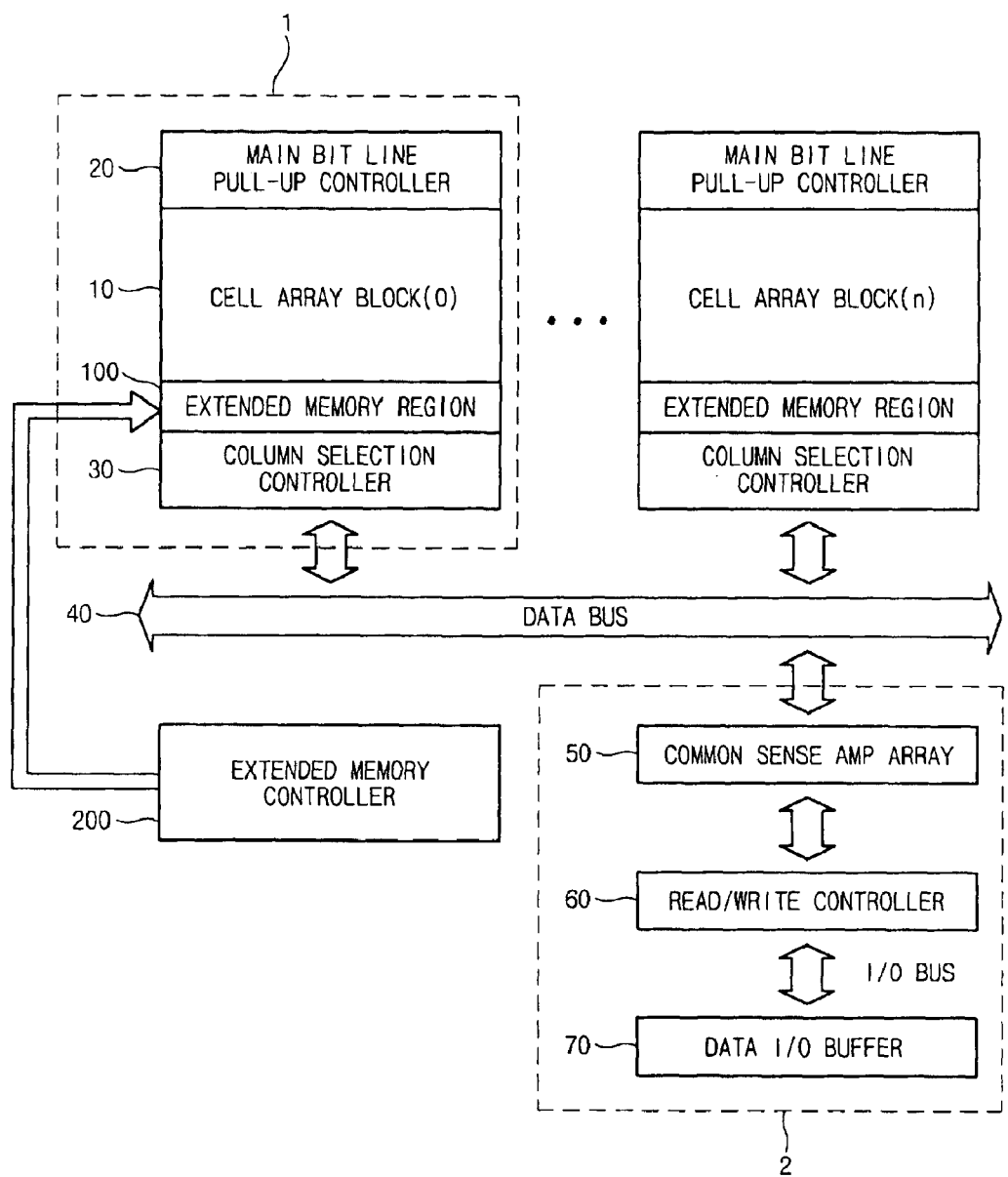
FIG. 4 is a block diagram illustrating a ferroelectric memory device including an extended memory unit according to an embodiment of the present invention.

FIG. 4 is a block diagram illustrating a ferroelectric memory device including an extended memory unit according to an embodiment of the present invention.

In an embodiment, the ferroelectric memory device comprises a cell region 1, a data bus unit 40, an input/output control region 2 and an extended memory controller 200.

The cell region 1 includes a main bitline pull-up controller 20, a cell array block 10, an extended memory unit 100 and a column selection controller 30. The ferroelectric memory device has a bitline structure including a main bitline and a plurality of sub bitlines. Each sub bitline is connected to the main bitline and a plurality of unit cells. Each sub bitline is connected to the main bitline via a switch. When a specific cell is accessed, only a sub bitline including the corresponding cell is connected to the main bitline. The main bitline pull-up controller 10 pulls up the main bitline to a positive voltage. The cell array block 10 includes a plurality of sub cell blocks. The extended memory unit 10 is configured to have the same structure as that of the sub cell block. The column selection controller 30 is connected to the main bitline and a data bus line in the data bus unit 40.

The input/output control region 2 includes a common sense amplifier array 50, a read/write controller 60 and a data input/output buffer 70. In a read mode, data stored in the cell array block 10 are outputted into the data input/output buffer 70 via the sense amplifier array 50. The sense amplifier array 50 amplifies the read data and stores the data in the same cell to restore cell data destroyed in the read mode. In a write mode, the sense amplifier array 50 amplifies externally inputted data and provides the amplified data to a cell.

Figure 5:
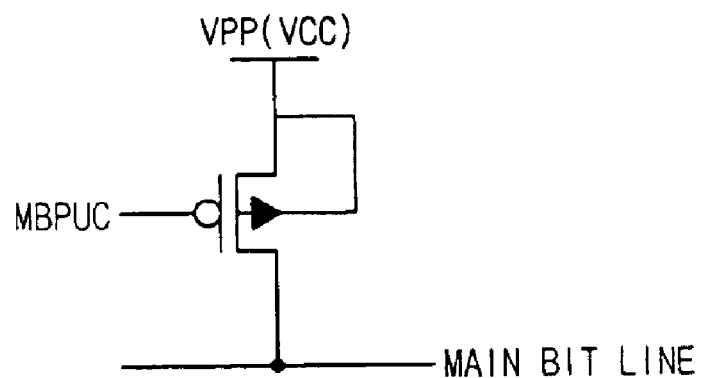
FIG. 5 is a circuit diagram illustrating a main bitline pull-up controller of FIG. 4.

FIG. 5 is a circuit diagram illustrating the main bitline pull-up controller 20 of FIG. 4. In a precharge mode, the main bitline pull-up controller 20 pulls up the main bitline to Vpp(Vcc) in response to a control signal MBPUC.

Figure 6:
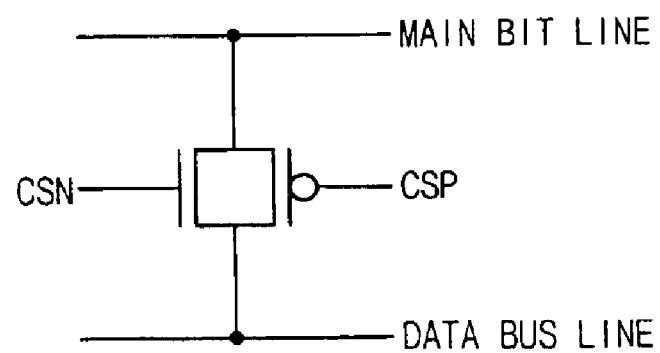
FIG. 6 is a circuit diagram illustrating a column selection controller of FIG. 4.

FIG. 6 is a circuit diagram illustrating the column selection controller 30 of FIG. 4. In read/write modes, the column selection controller 30 connects a data bus line to the main bitline in response to control signals CSN and CSP.

Figure 7A:
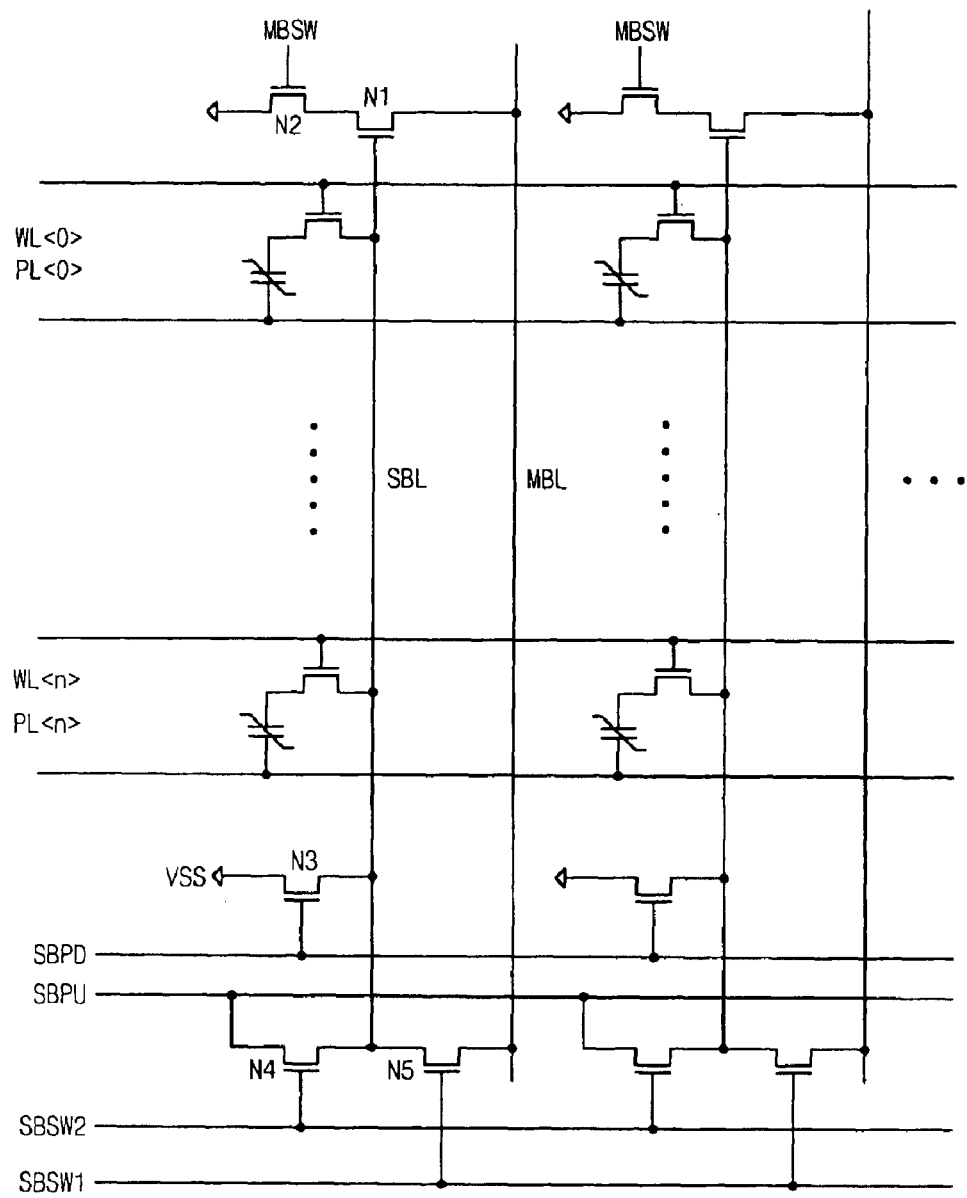
FIGS. 7a and 7b are circuit diagrams illustrating sub cell blocks of a cell array block of FIG. 4.
Figure 7B:
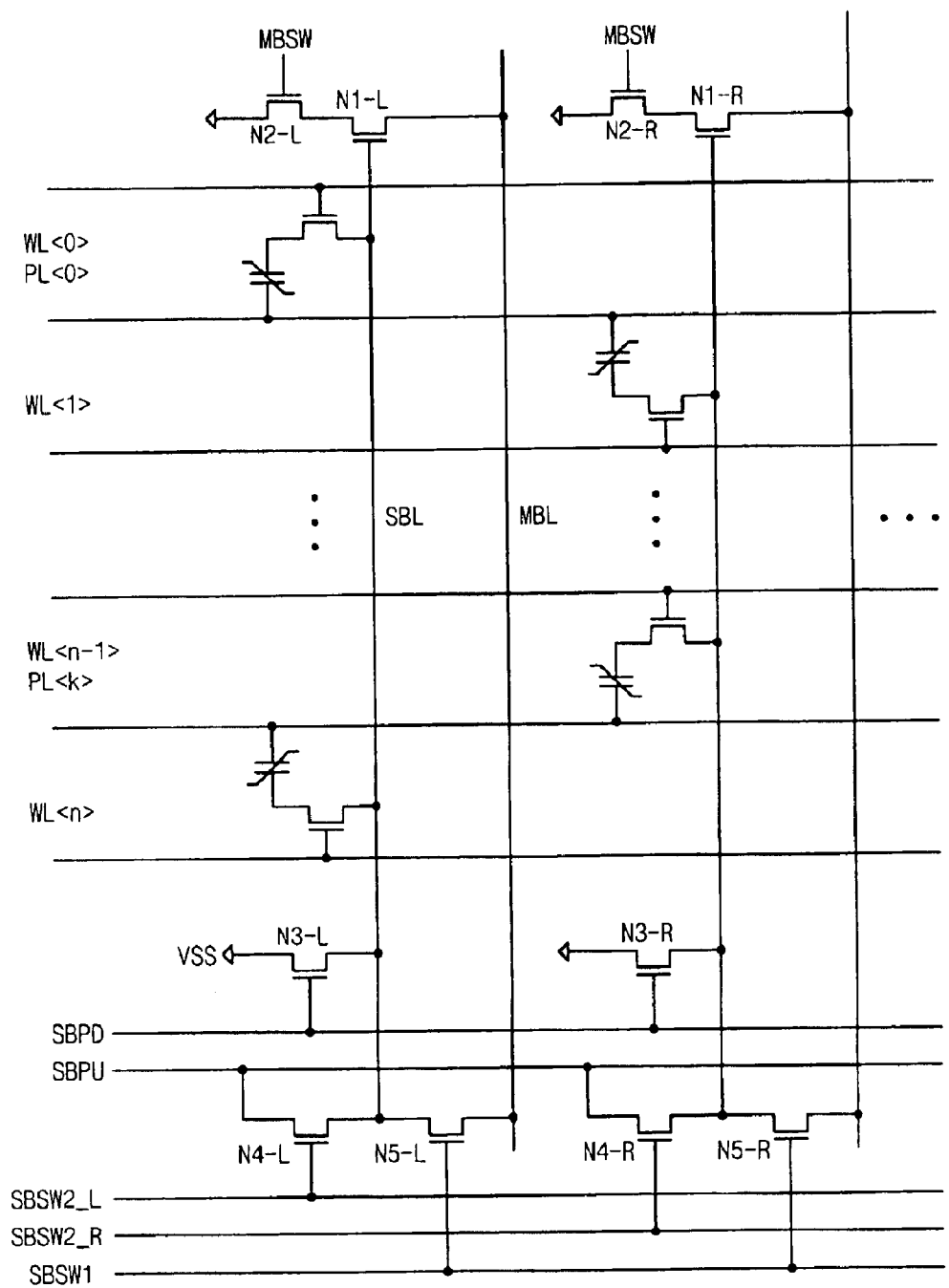

FIGS. 7a and 7b are circuit diagrams illustrating sub cell blocks of the cell array block 10 of FIG. 4. The configuration of the sub cell block is divided into two types depending on arrangement of a plateline PL<n>. One type is an open bitline configuration where a plateline PL<n> is arranged in each unit cell (see FIG. 7a). The other type is a folded bitline configuration where a plateline PL<n> is arranged in every two unit cells (see FIG. 7b).

When the two types have the same number of cells, a main bitline MBL of the open bitline configuration corresponds to two main bitlines MBL of the folded bitline configuration. In other words, the whole configuration of FIG. 7b corresponds to a half configuration of FIG. 7a (see symbols of the elements). Since the principle of operations of both types is in common, the operations will be explained based on the open bitline configuration.

A sub cell block comprises a sub bitline SBL and NMOS transistors N1~N5. The sub bitline SBL is commonly connected to a plurality of unit memory cells. Each unit memory cell is connected to a wordline WL<n> and a plateline PL<n>. The NMOS transistor N1 for regulating current has a gate connected to a first terminal of the sub bitline SBL, and a drain connected to a main bitline MBL. The NMOS transistor N2 has a gate connected to a control signal MBSW, a drain connected to a source of the NMOS transistor N1, and a grounded source. The NMOS transistor N3 has a gate connected to a control signal SBPD, a drain connected to a second terminal of the sub bitline SBL, and a grounded source. The NMOS transistor N4 has a gate connected to a control signal SBSW2, a source connected to the second terminal of the sub bitline SBL, and a drain connected to a control signal SBPU. The NMOS transistor N5 has a gate connected to a control signal SBSW1, a drain connected to the main bitline MBL, and a source connected to the second terminal of the sub bitline SBL.

A main bitline MBL is connected to a plurality of sub bitlines SBL. When a cell is accessed, a sub bitline SBL connected to the corresponding cell is connected to the main bitline MBL. Therefore, the driving load of the main bitline MBL is reduced to that of one sub bitline SBL. Here, the sub bitline SBL is connected to the main bitline MBL by the control signal SBSW1.

The pull-down NMOS transistor N3 regulates a potential of the sub bitline SBL to a ground level when the control signal SBPD is activated.

The control signal SBPU regulates a power voltage to be supplied to the sub bitline SBL. When a high voltage is required, a voltage higher than a VCC voltage is supplied.

The control signal SBSW1 controls signal flow between the sub bitline SBL and the main bitline MBL. The control signal SBSW2 controls signal flow between the control signal SBPU and the sub bitline SBL. The sub bitline SBL is connected to a plurality of unit cells.

The sub bitline SBL connected to the gate of the NMOS transistor N1 controls a sensing voltage of the main bitline MBL.

Figure 8A:
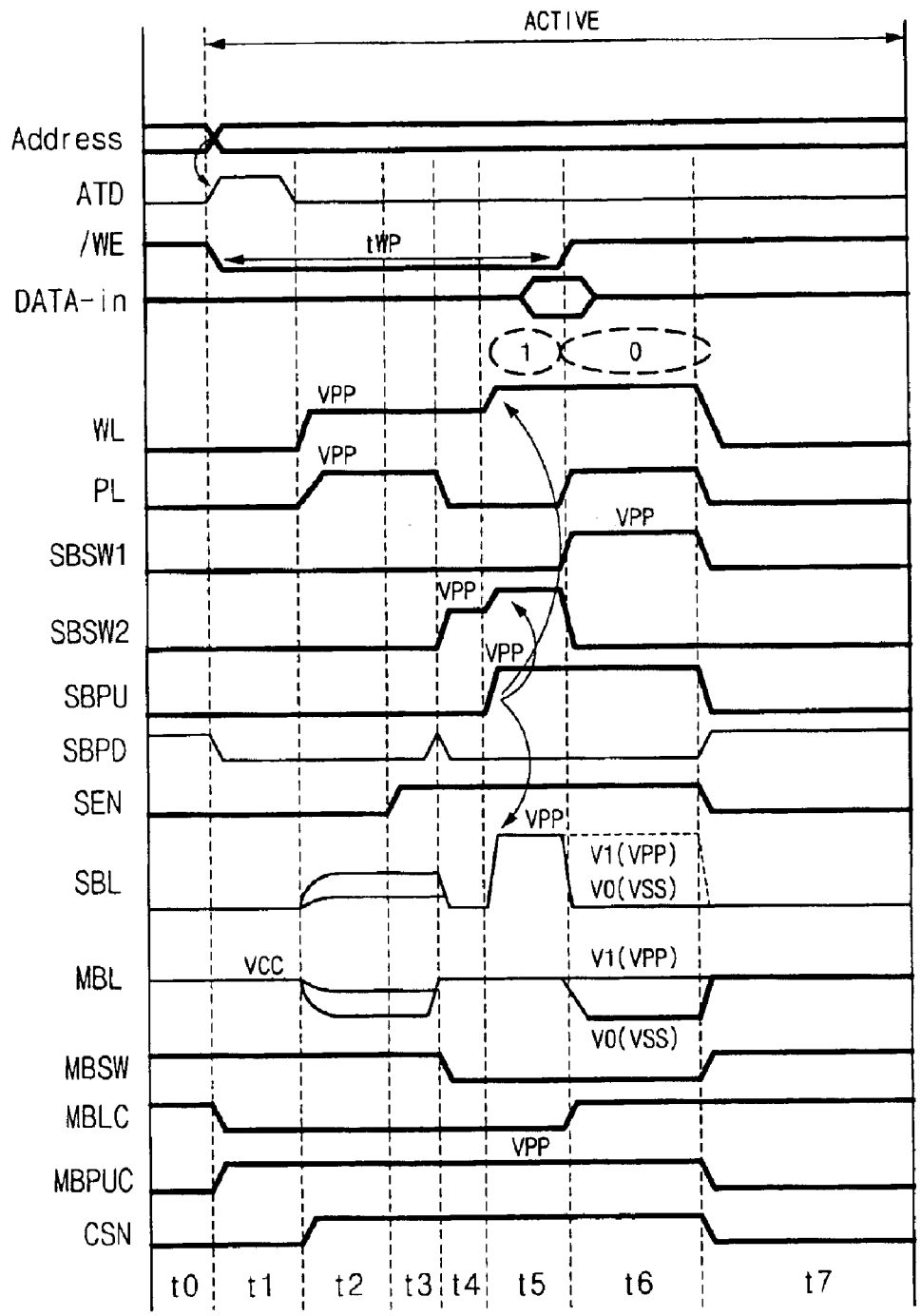

FIG. 8a is a timing diagram illustrating a write operation of the sub cell block of FIG. 7a.

If an address is inputted and a write enable signal is activated (t1), the wordline WL and the plateline PL are activated. Charges stored in a cell move to the bitline and a data level of the cell (t2, t3) is detected.

The main bitline is connected to a positive power via a resistive transistor (not shown). If data of the cell is "high", the sub bitline SBL also becomes "high". Since current flowing in the NMOS transistor N1 becomes larger, the voltage drop of the resistive transistor (not shown) becomes large. As a result, a voltage of the main bitline becomes lower than the reference level. On the other hand, if data of the cell is "low", the sub bitline SBL also becomes "low". Since current flowing in the NMOS transistor N1 becomes smaller, the voltage drop of the resistive transistor (not shown) becomes small. As a result, a voltage of the main bitline becomes higher than the reference level. In this way, data stored in the cell can be detected.

In an interval t4, a self-boosting operation is prepared. If the control signal SBSW2 becomes "high" while the control signal SBPU is maintained at a low level, charges are charged in a parasitic capacitor between the gate and the source or the drain of the NMOS transistor N4. In an interval t5, if the control signal SBPU is "high", potentials of the control signal SBSW2, the sub bitline SBL and the wordline WL are boosted by potential differences generated by the charges in the parasitic capacitors. In the interval t5, data "1" is automatically stored in the cell because the sub bitline SBL is "high" and the plateline PL is "low".

If data outputted into the main bitline MBL through the input/output buffer is "0", the control signal SBSW1 is activated and the control signal SBSW2 is inactivated. Then, if the plateline PL is "high", the sub bitline SBL becomes "low". As charges stored in the cell move to the sub bitline SBL, the data "0" is written in the cell (t6). On the other hand, when data outputted to the main bitline MBL is "1", voltages of the plateline PL and the sub bitline SBL become both "high". As a result, the stored data "1" of the interval t5 is maintained.

Figure 8B:
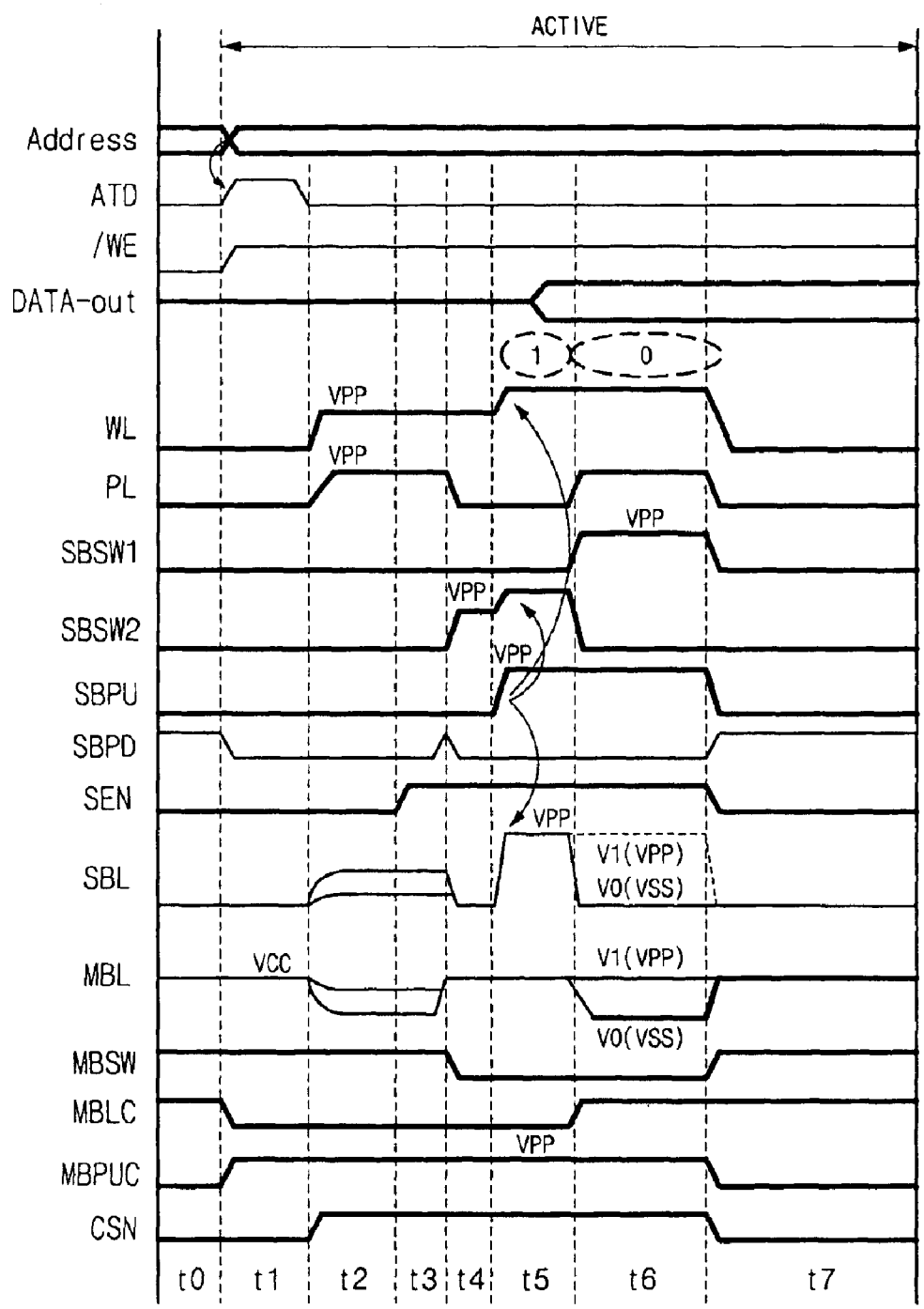

FIG. 8b is a timing diagram illustrating a read operation of the sub cell block of FIG. 7a.

In intervals t2 and t3, a level of a signal written in a cell is detected. In an interval t5, data "1" is written. In an interval t6, data "0" is restored.

The operations in the intervals t2~t4 are identical to those of FIG. 8a. After a read operation, a restore operation to restore destroyed data of a cell in the read operation is required. In the intervals t5 and t6, a restore operation is performed. In the interval t5, data "1" is restored regardless of the originally stored value. In the interval t6, data "0" is restored. The detail explanation of the restore operation is omitted because it is identical to the write operation.

Figure 9:
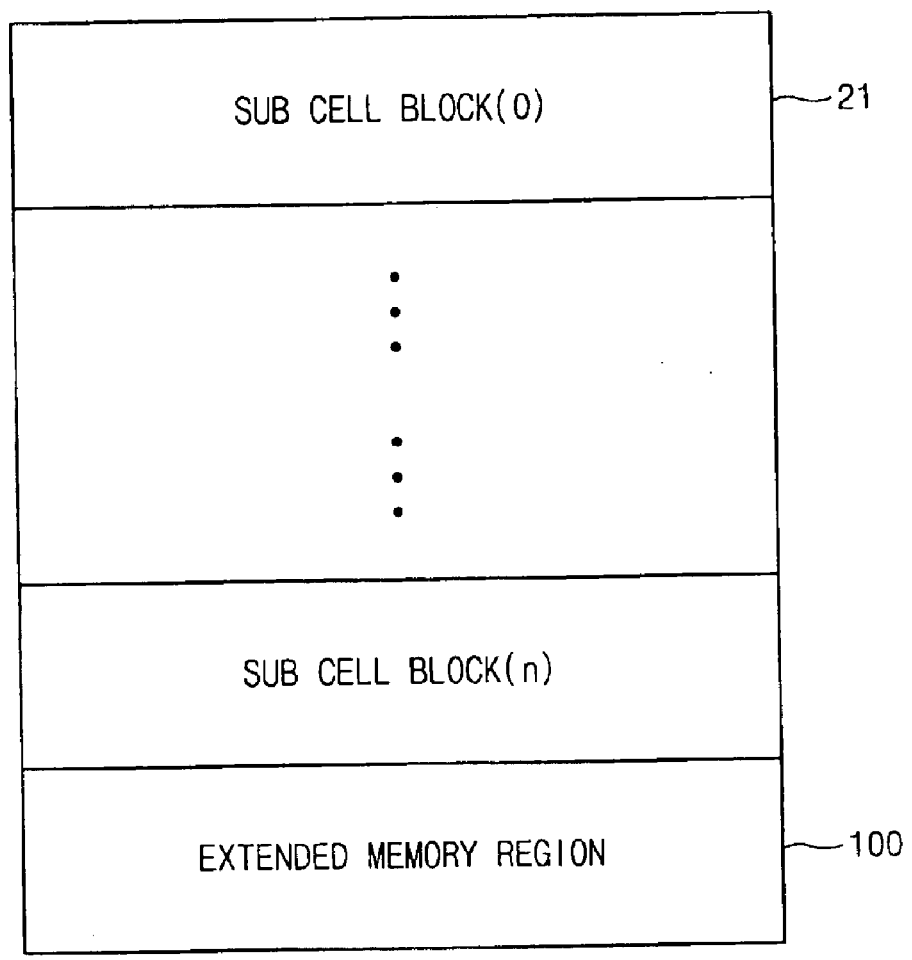
FIG. 9 is a block diagram illustrating a first example of the extended memory unit of FIG. 4.

FIG. 9 is a block diagram illustrating a first example of the extended memory unit 100 of FIG. 4. In the first example, the extended memory unit 100 is configured to have the same structure as that of the sub cell block 21 of FIG. 7a or 7b, and to use the whole unit cells as a memory region.

Figure 10A:
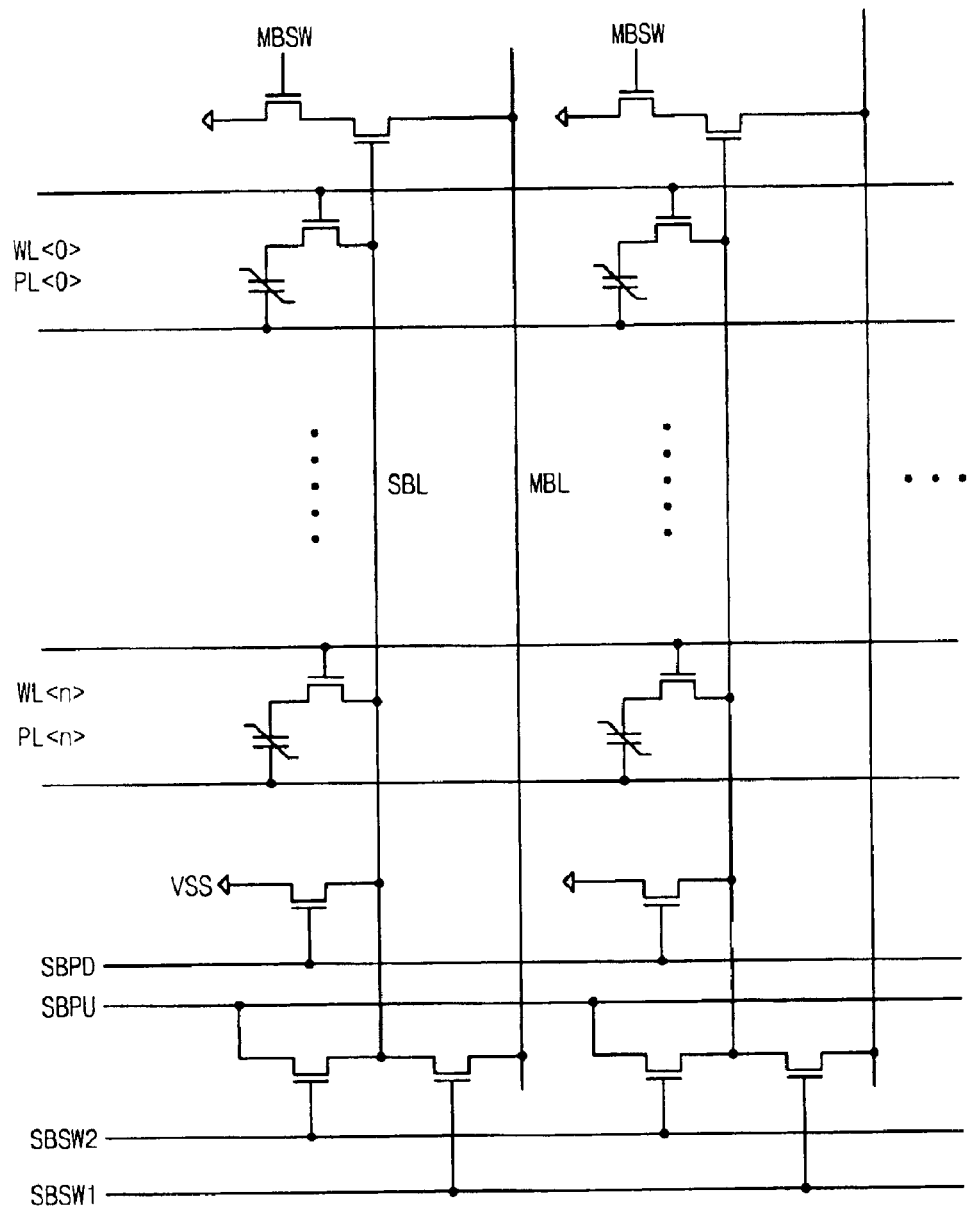
FIGS. 10a and 10b are circuit diagrams illustrating the extended memory unit of FIG. 9.
Figure 10B:
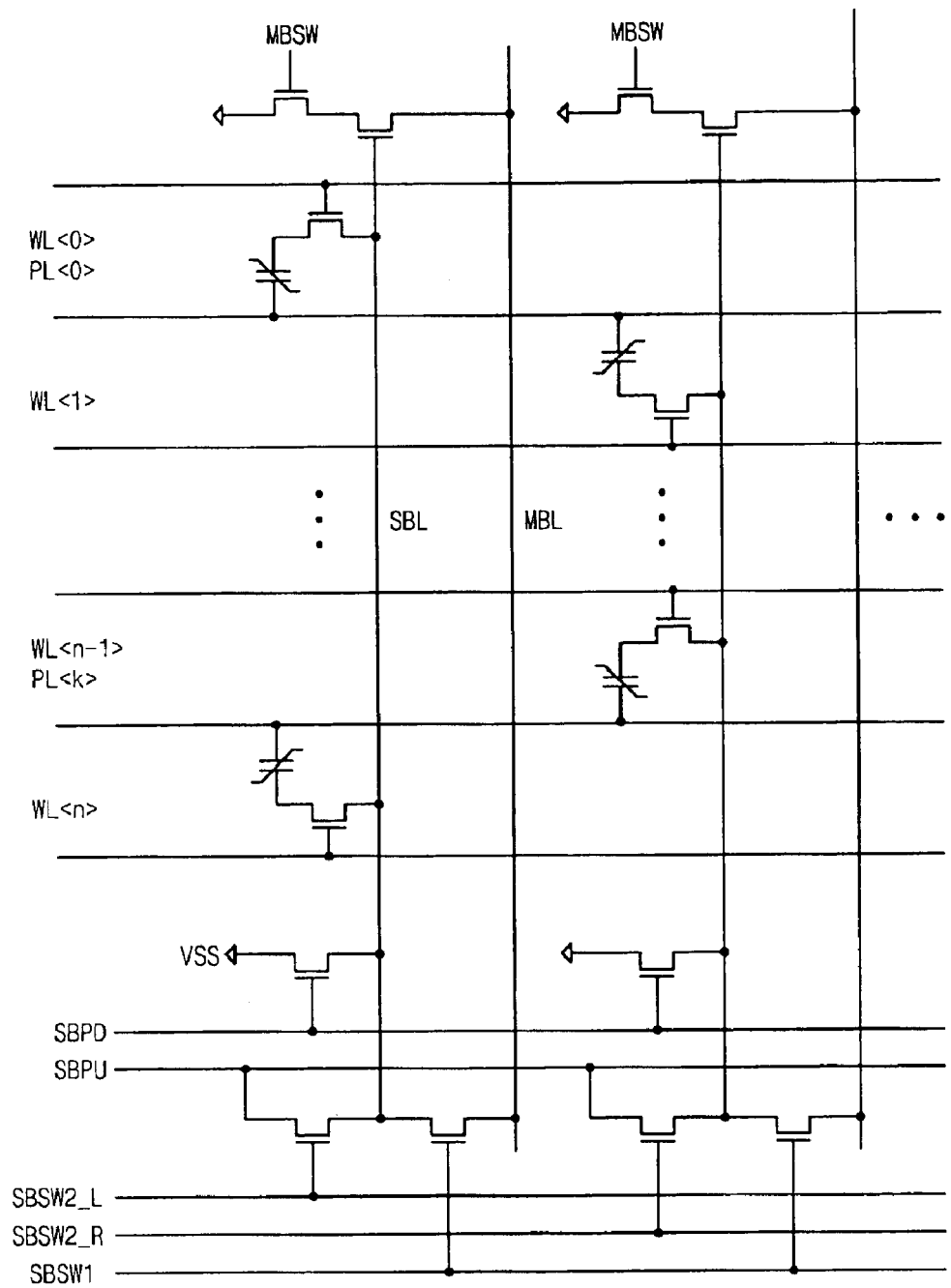

FIGS. 10a and 10b are circuit diagrams illustrating the extended memory unit 100 of FIG. 9. When the sub cell block 21 is configured to have an open bitline type, the extended memory unit 100 is also configured to have the open bitline type (see FIG. 10a). When the sub cell block 21 is configured to have a folded bitline type, the extended memory unit 100 is also configured to have the folded bitline type (see FIG. 10b). The extended memory unit 100 can include a plurality of cell blocks shown in FIG. 10a or 10b.

Figure 11:
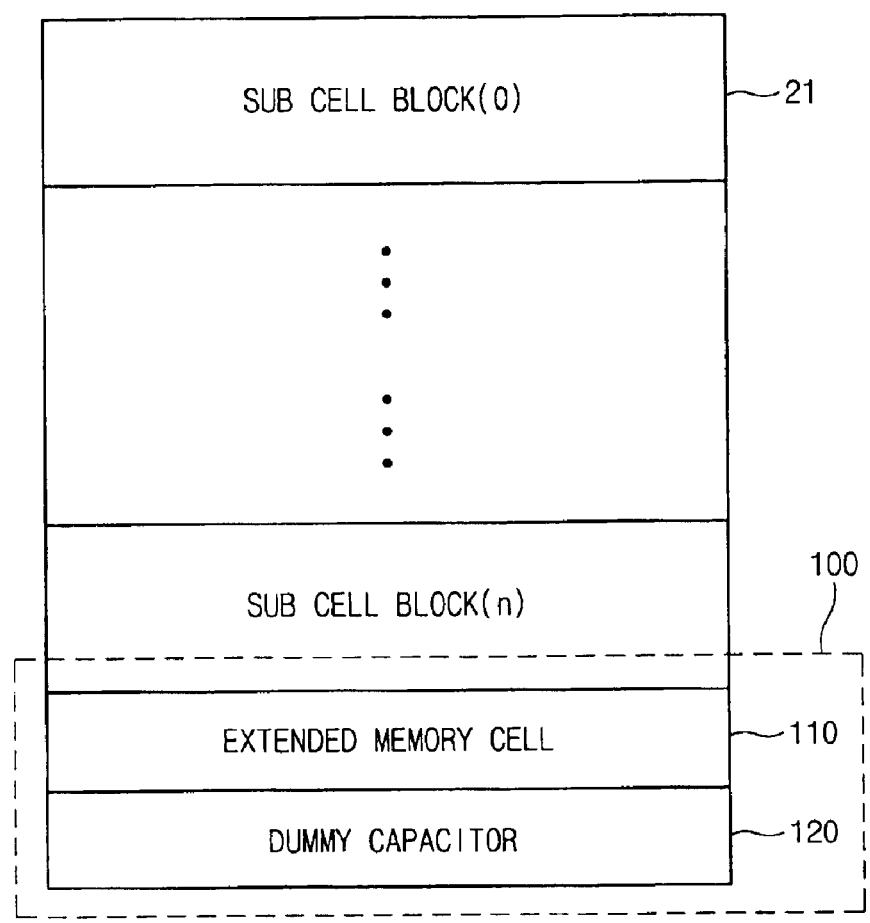
FIG. 11 is a block diagram illustrating a second example of the extended memory unit of FIG. 4.

FIG. 11 is a block diagram illustrating a second example of the extended memory unit 100 of FIG. 4. In the second example, the extended memory unit 10 is configured to have the same structure as that of the sub cell block 21. The number of unit cells in the extended cell region 110 is smaller than that of unit cells in the sub cell block 21. The extended memory unit 100 is connected to a dummy capacitor 120 for compensating for difference in capacitance resulting from difference in the number of the unit cells, thereby having the same driving characteristic as that of the sub cell block 21.

Figure 12A:
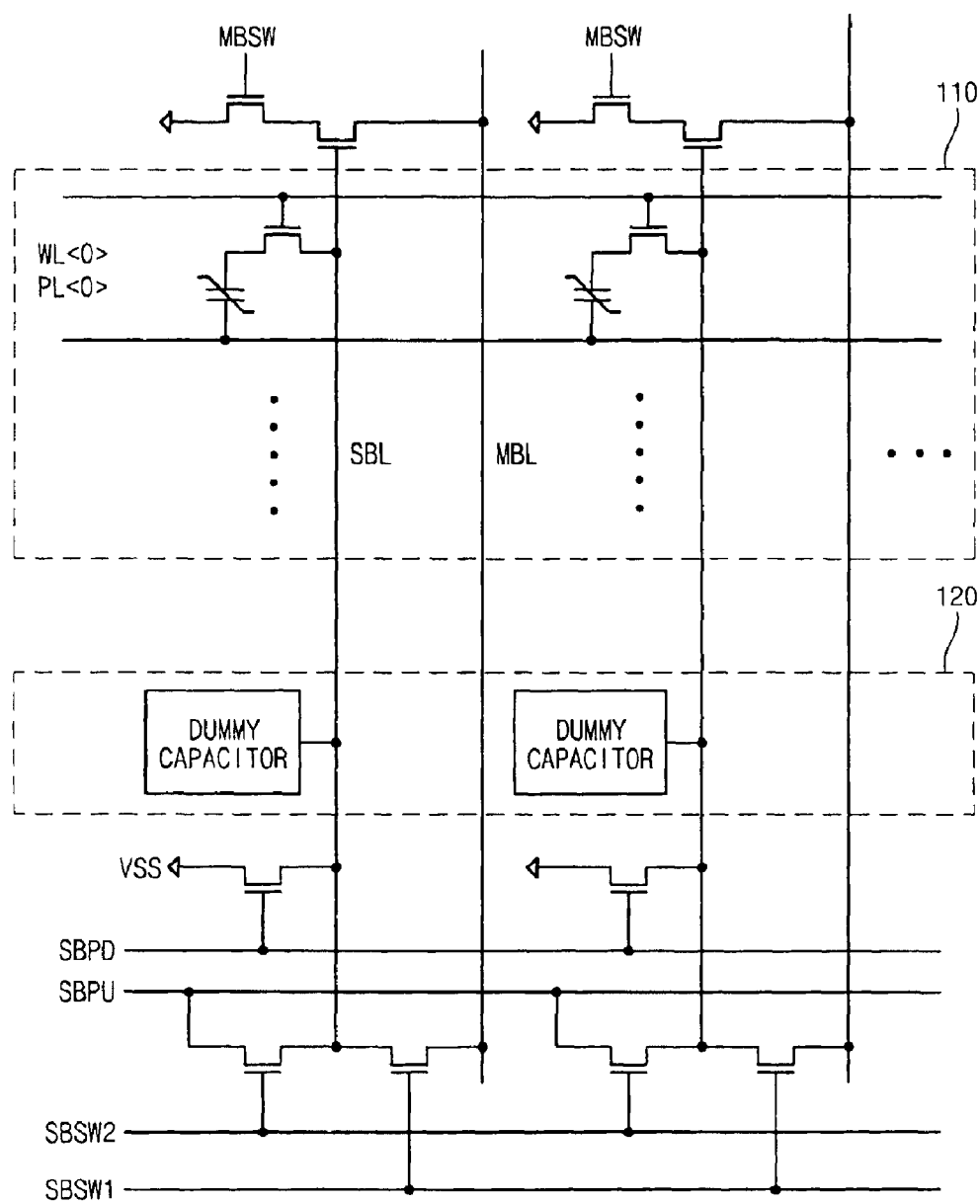
FIGS. 12a and 12b are circuit diagrams illustrating the extended memory unit of FIG. 11.
Figure 12B:
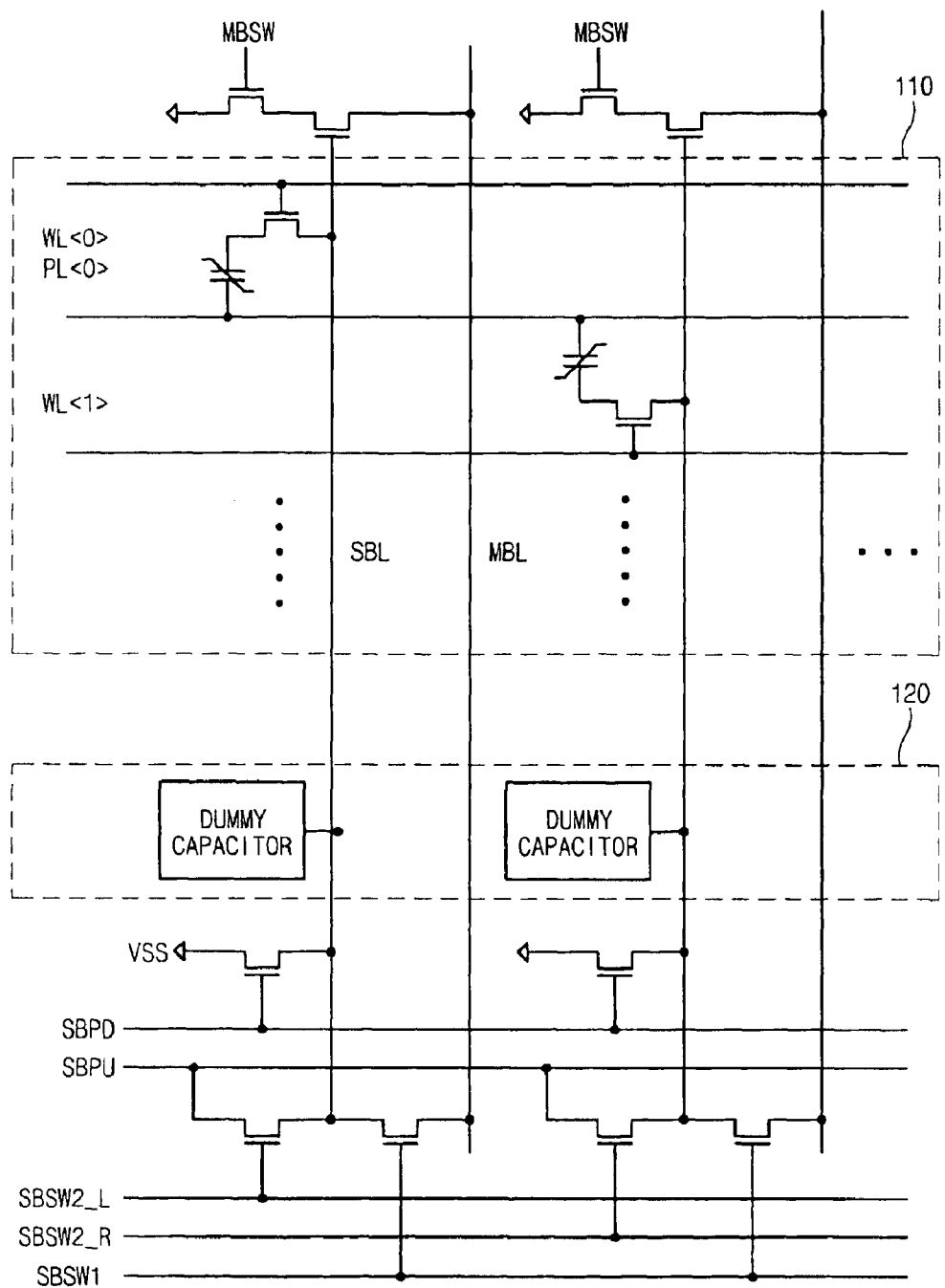

FIGS. 12a and 12b are circuit diagrams illustrating the extended memory unit 100 of FIG. 11. When the sub cell block 21 is configured to have an open bitline type, the extended memory unit 100 is also configured to have the open bitline type (see FIG. 12a). When the sub cell block 21 is configured to have a folded bitline type, the extended memory unit 10 is also configured to have the folded bitline type (see FIG. 12b).

Figure 13:
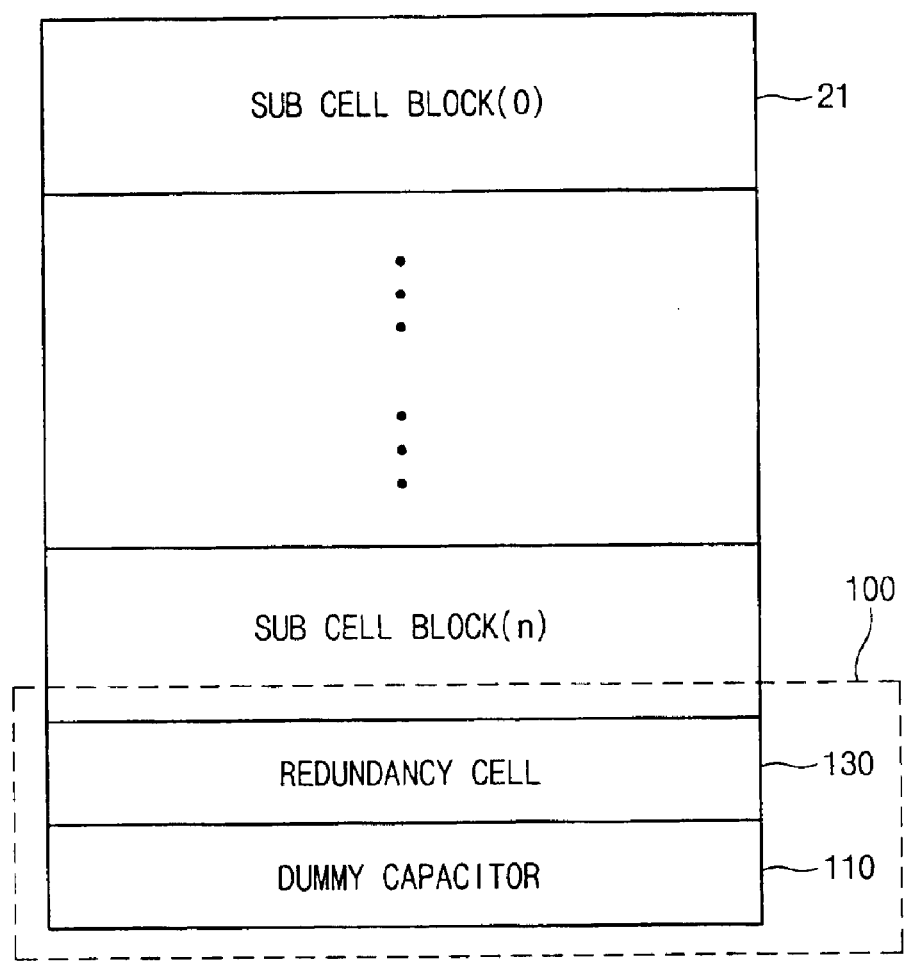
FIG. 13 is a block diagram illustrating a third example of the extended memory unit of FIG. 4.

FIG. 13 is a block diagram illustrating a third example of the extended memory unit 100 of FIG. 4. In the third example, the extended memory unit 100 includes the extended cell region 110 and a redundancy cell region 130.

Figure 14A:
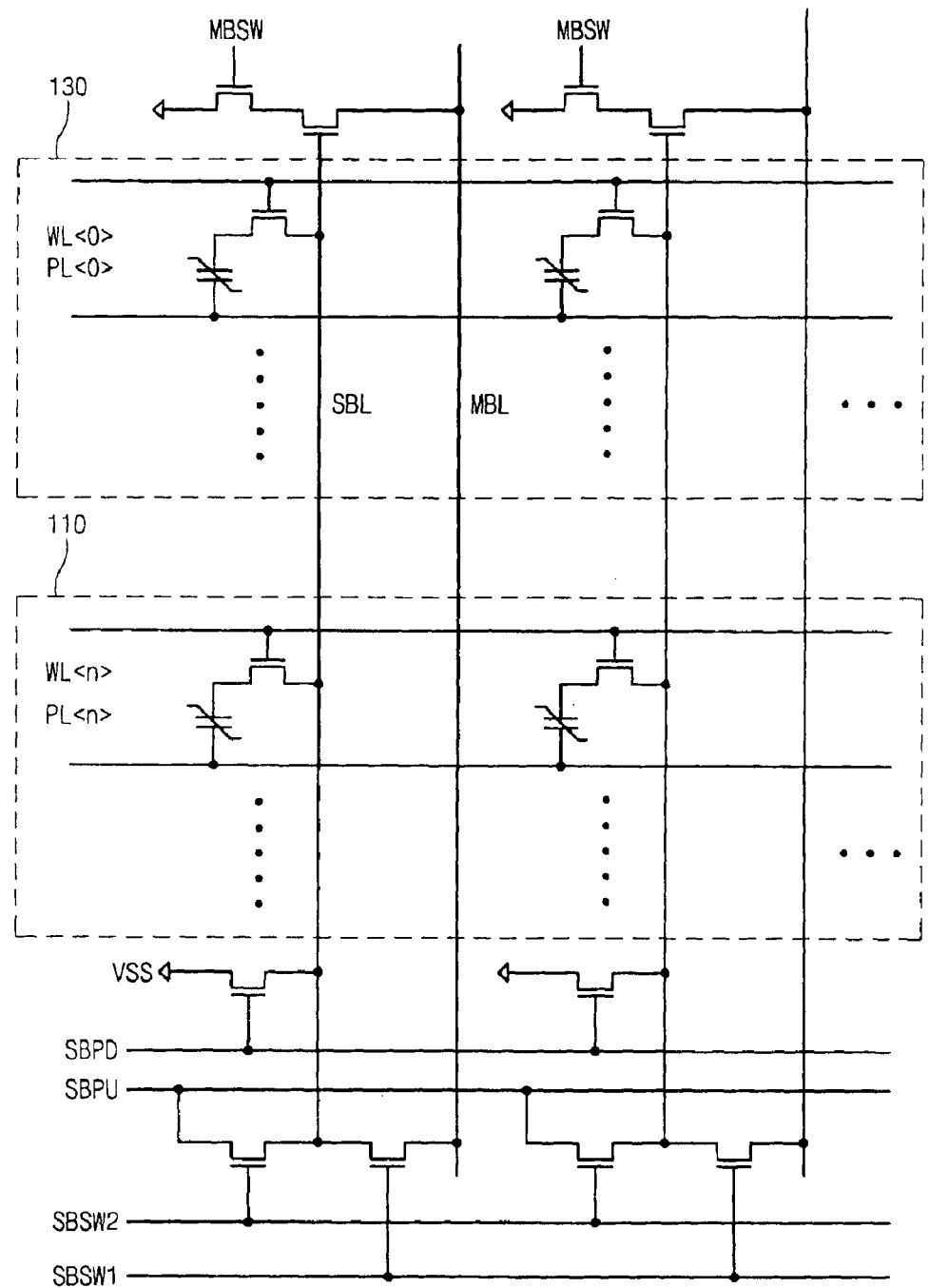
FIGS. 14a and 14b are circuit diagrams illustrating the extended memory unit of FIG. 13.
Figure 14B:
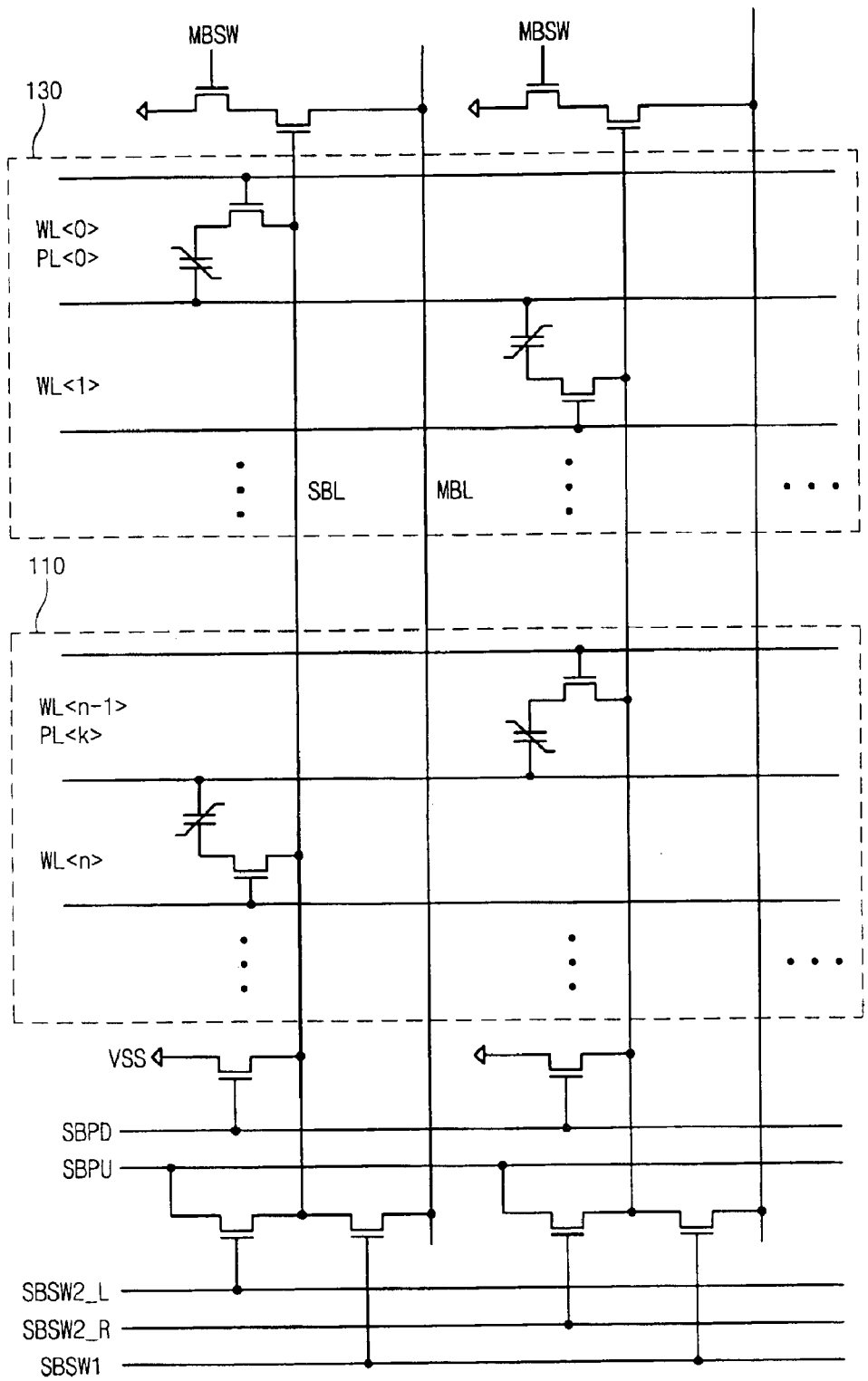

FIGS. 14a and 14b are circuit diagrams illustrating the extended memory unit 100 of FIG. 13. When the sub cell block 21 is configured to have an open bitline type, the extended memory unit 100 is also configured to have the open bitline type (see FIG. 14a). When the sub cell block 21 is configured to have a folded bitline type, the extended memory unit 10 is also configured to have the folded bitline type (see FIG. 14b).

Figure 15:
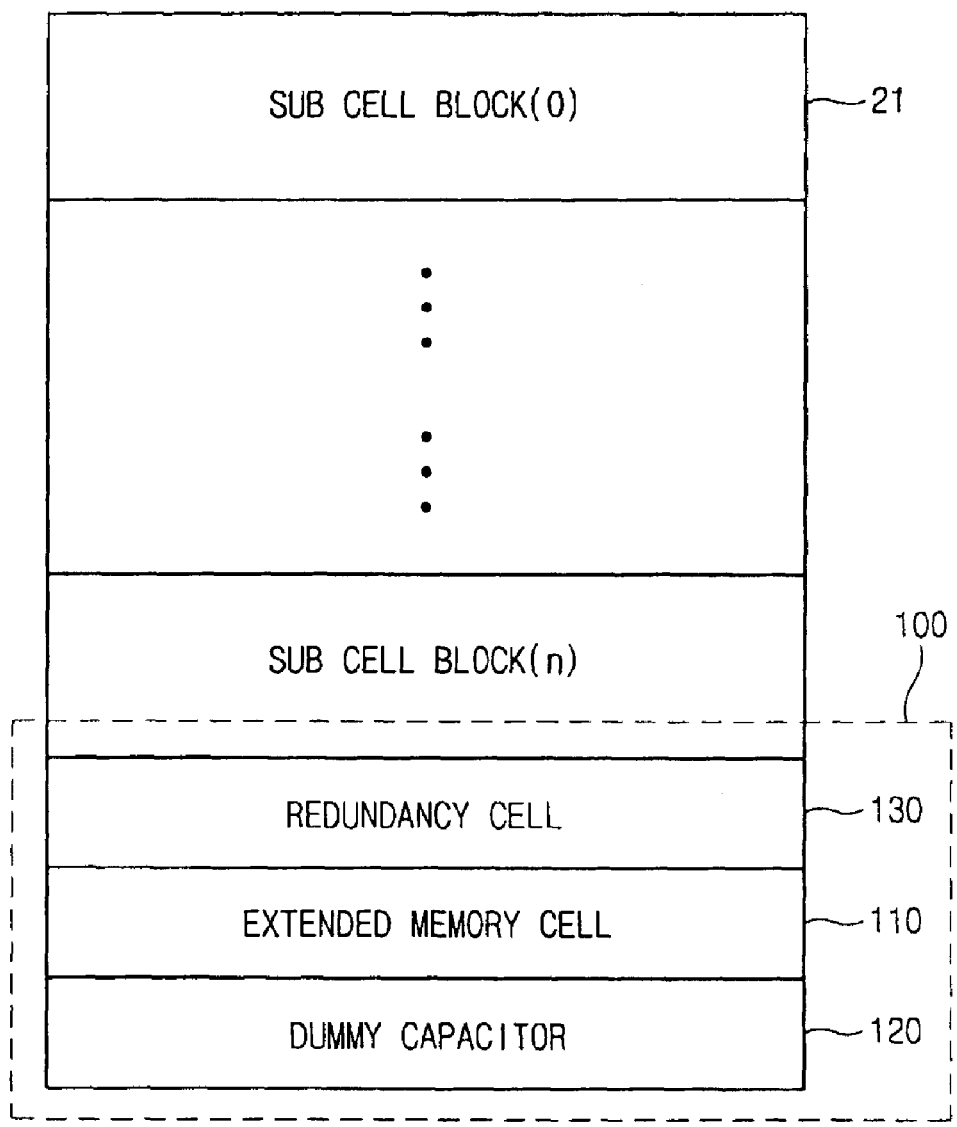
FIG. 15 is a block diagram illustrating a fourth example of the extended memory unit of FIG. 4.
Figure 16A:
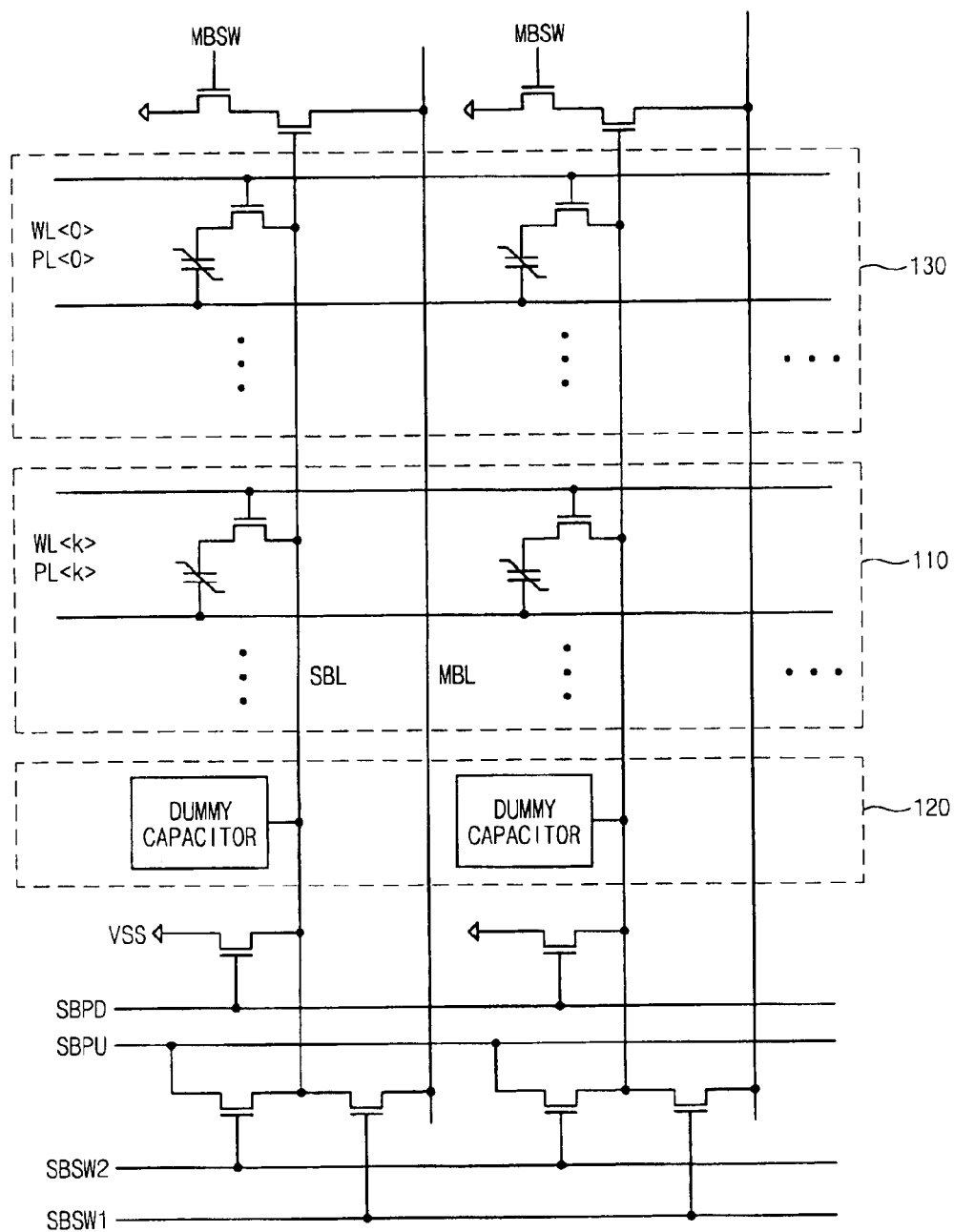
FIGS. 16a and 16b are circuit diagrams illustrating the extended memory unit of FIG. 15.
Figure 16B:
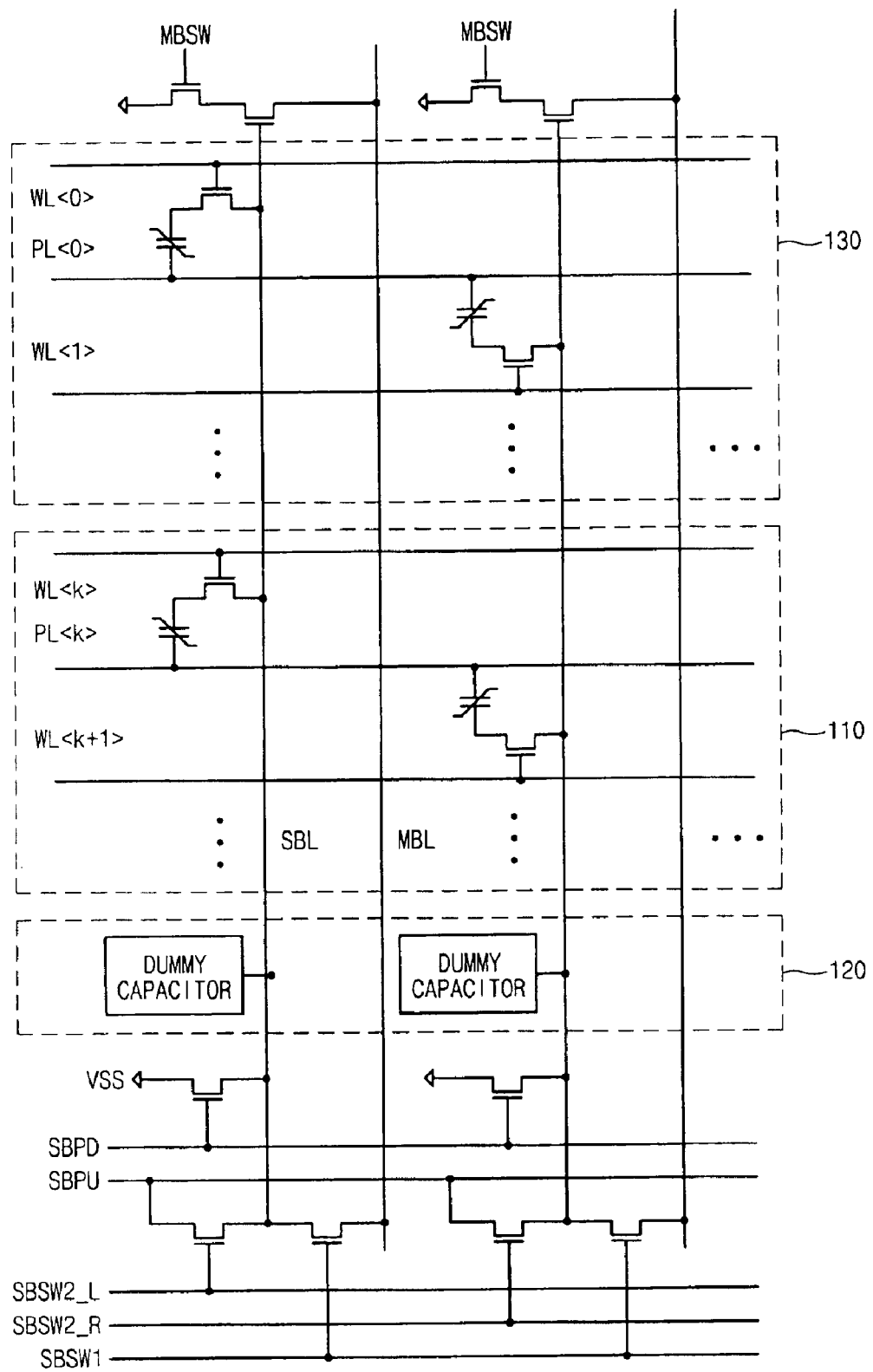

FIG. 15 is a block diagram illustrating a fourth example of the extended memory unit 100 of FIG. 4. The extended memory unit 100 includes the smaller number of unit cells than that of the unit cells in the sub cell block 21. Some unit cells are allotted to the redundancy cell region 130, the other unit cells to the extended cell region 110. The cell block 100 includes dummy capacitor 120 that compensates for difference in capacitance resulting from difference in the number of the unit cells FIGS. 16a and 16b are circuit diagrams illustrating the extended memory unit 100 of FIG. 15. When the sub cell block 21 is configured to have an open bitline type, the extended memory unit 100 is also configured to have the open bitline type (see FIG. 16a). When the sub cell block 21 is configured to have a folded bitline type, the extended memory unit 10 is also configured to have the folded bitline type (see FIG. 16b).

Figure 17:
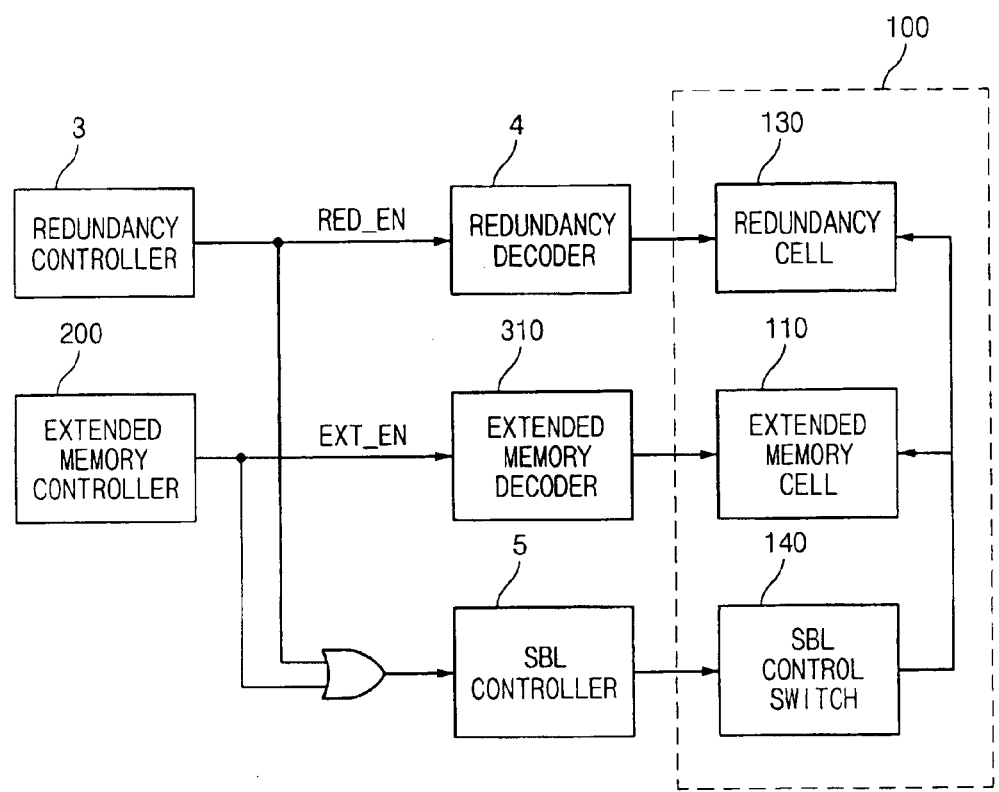
FIG. 17 is a block diagram illustrating the structure of the extended memory unit including a redundancy cell region and an extended cell region.

FIG. 17 is a block diagram illustrating the structure of the extended memory unit 100 including the redundancy cell region 130 and the extended cell region 110. The structure of FIG. 17 is applied to the third and fourth examples shown in FIGS. 13 to 16. Hereinafter, the structure of FIG. 17 is explained with reference to FIG. 14a.

Referring to FIG. 14a, there are unit cellsin the redundancy cell region 130 and the extended cell region 110. The control operation on the control signals MBSW, SBPD, SBPU, SBSW2 and SBSW1 of FIG. 14a is in common when the redundancy cell region 130 or the extended cell region 110 is accessed. However, the control operation of each plateline and each wordline is separately performed in a corresponding region.

When the redundancy cell region 130 is accessed, a redundancy controller 3 activates a control signal RED_EN. When the extended cell region 110 is accessed, the extended memory controller 20 activates a control signal EXT_EN. When the control signal RED_EN is activated, a redundancy decoder 4 operates to control the redundancy cell region 130. When the control signal EXT_EN is activated, a extended memory decoder 310 operates to control the extended cell region 110. A sub bitline controller 5 operates to control a sub bitline control switch 140 when the control signal RED_EN or EXT_EN is activated. The sub bitline control switch 140 controls the control signals MBSW, SBPD, SBPU, SBSW2 and SBSW1 of FIG. 14a.

Figure 18:
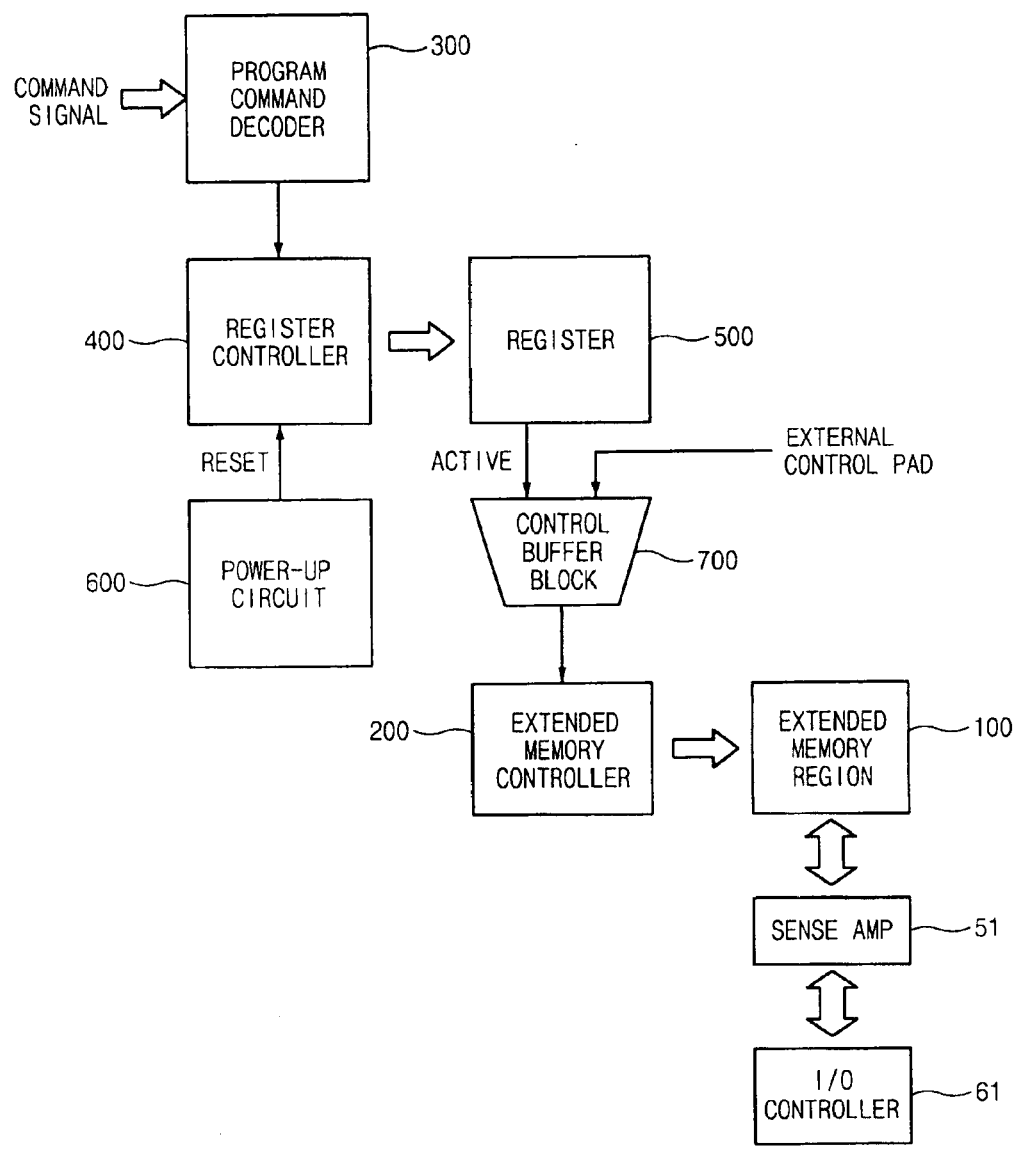
FIG. 18 is a block diagram illustrating a register for controlling the extended memory unit.

FIG. 18 is a block diagram illustrating a register 500 for controlling the extended memory controller 200.

In an embodiment, the ferroelectric memory device further comprises a program command decoder 300, a register controller 400, a register 500, a power-up circuit 600 and a control buffer block 700.

The register 500 including a ferroelectric capacitor can maintain externally inputted data when power is off.

The program command decoder 300 decodes an external command signal to program the register. The register controller 400 stores predetermined data in the register 500 when an output signal of the program command decoder 300 is activated. When the memory device is actually applied to a system, if the system power is on, the register controller 400 is controlled by the power-up circuit 600. The register controller 400 reads data stored in the register if the reset signal RESET generated from the power-up circuit 600 is activated. The register 500 is programmed to control a control signal ACTIVE.

External control signals outputted from an external control pad as well as the control signal ACTIVE outputted from the register 500 are inputted into the control buffer block 700. In an embodiment, the control buffer block 700 controls the extended memory controller 200 in response to the external control signals when the control signal ACTIVE is activated. If the control signal ACTIVE is inactivated, the extended memory unit 100 is not accessed although a signal is inputted into the external control pad.

In another embodiment, a plurality of the registers 500 may be used and the control signal ACTIVE comprises a plurality of bits. If an external control signal inputted from the external control pad coincides with the control signal ACTIVE, the control buffer block 700 decodes the external control signal and outputs a control signal corresponding to the external control signal into the extended memory control unit 200. However, when the external signal does not coincide with the code, the extended memory controller 200 is inactivated and the extended memory unit 100 is not controlled.

Figure 19:
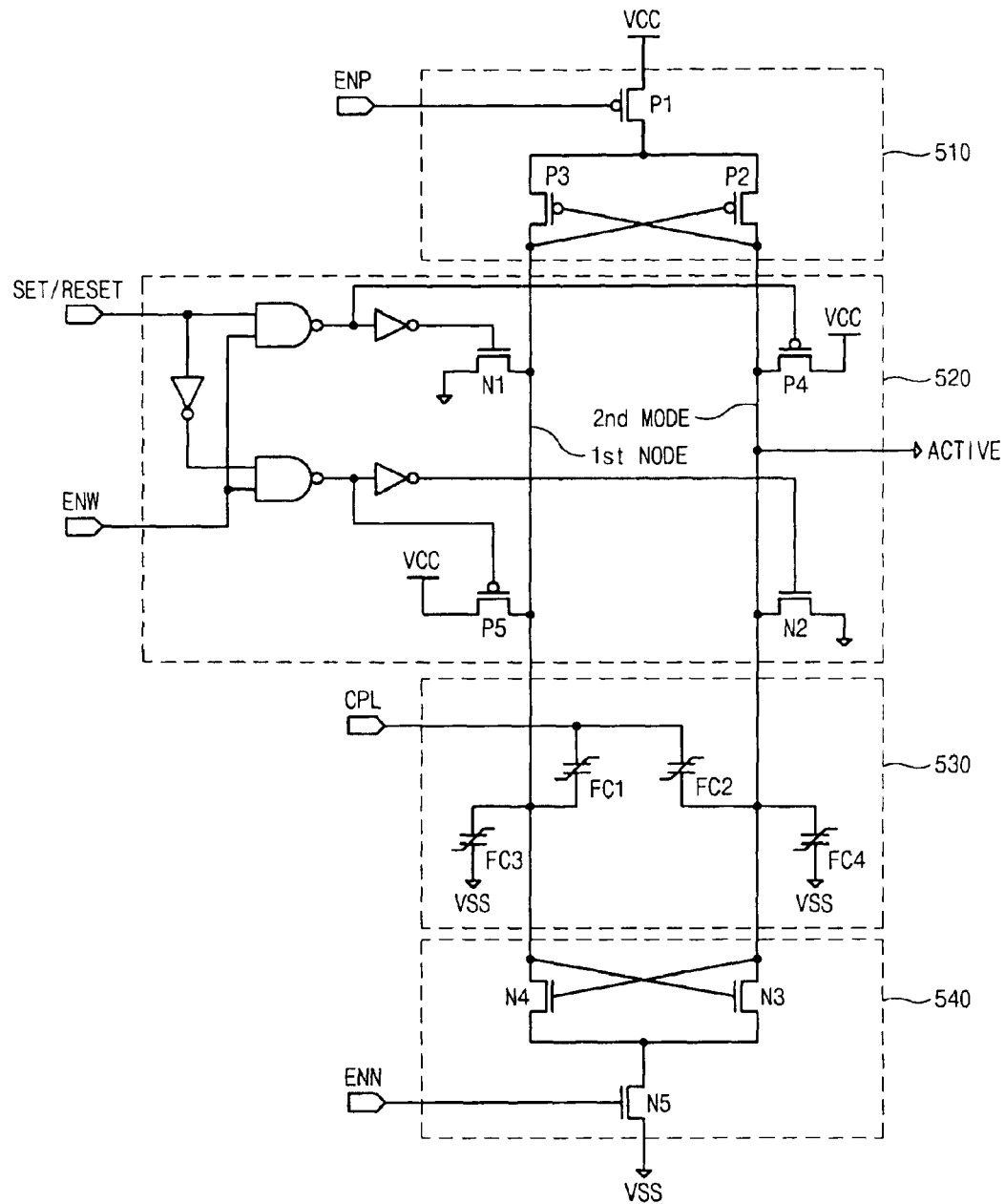
FIG. 19 is a circuit diagram illustrating the register of FIG. 18.

FIG. 19 is a circuit diagram illustrating the register 500 of FIG. 18. The register 500 comprises a first amplifier 510, an input unit 520, a storage unit 530 and a second amplifier 540.

The first amplifier 510 comprises PMOS transistors P1, P2 and P3. The PMOS transistor P1 has a gate to receive a first control signal ENP and a source connected to a positive power. The PMOS transistor P2 has a gate connected to a first node, a source connected to a drain of the PMOS transistor P1, and a drain connected to a second node. The PMOS transistor P3 has a gate connected to the second node, a source connected to the drain of the PMOS transistor P1, and a drain connected to the first node.

The second amplifier 540 comprises NMOS transistors N3, N4 and N5. The NMOS transistor N3 has a gate connected to the first node and a drain connected to the second node. The NMOS transistor N4 has a gate connected to the second node and a drain connected to the first node. The NMOS transistor N5 has a gate to receive a second control signal ENN, a drain connected to a common source of the NMOS transistors N3 and N4, and a source connected to ground.

The input unit 520 comprises PMOS transistors P4 and P5, and NMOS transistors N1, N2 and N3. The PMOS transistor P4 has a gate to receive a NAND operation result of a data signal SET/RESET and a third control signal ENW, a source connected to a positive power, and a drain connected to the second node. The NMOS transistor N1 has a gate to receive an AND operation result of the data signal SET/RESET and the third control signal ENW, a source connected to ground, and a drain connected to the first node. The NMOS transistor N2 has a gate to receive an AND operation result of a signal obtained by inverting the data signal SET/RESET and the third control signal ENW, a source connected to ground, and a drain connected to the second node. The PMOS transistor P5 has a gate to receive a NAND operation result of a signal obtained by inverting the data signal SET/RESET and the third control signal ENW, a source connected to a positive power, and a drain connected to the first node.

The storage unit 530 comprises ferroelectric capacitors FC1, FC2, FC3 and FC4. The ferroelectric capacitor FC1 is connected between a fourth control signal CPL and the first node. The ferroelectric capacitor FC2 is connected between the fourth control signal CPL and the second node. The ferroelectric capacitor FC3 is connected between the first node and ground. The ferroelectric capacitor FC4 is connected between the second node and ground.

When the control signal ENP is "low" and the control signal ENN is "high", the first amplifier 510 and the second amplifier 540 fix the first node and the second node at VCC and VSS (or vice versa) depending on voltage difference between the first node and the second node. When the control signal ENP is "high" and the control signal ENN is "low", the register 500 is cut off from power.

When the control signal ENW is "high" and the data signal SET/RESET is "high", the input unit 520 sets the first node "low" and the second node "high". When the data signal SET/RESET is "low", the input unit 520 sets the first node "high" and the second node "low". When the control signal ENW is "low", the first node and the second node are cut off from the data signal SET/RESET.

The storage unit 530 stores data outputted to the first node and the second node in the ferroelectric capacitors FC1, FC2, FC3 and FC4 by regulating the control signal CPL.

The output signal ACTIVE is outputted from the second node.

Figure 20A:
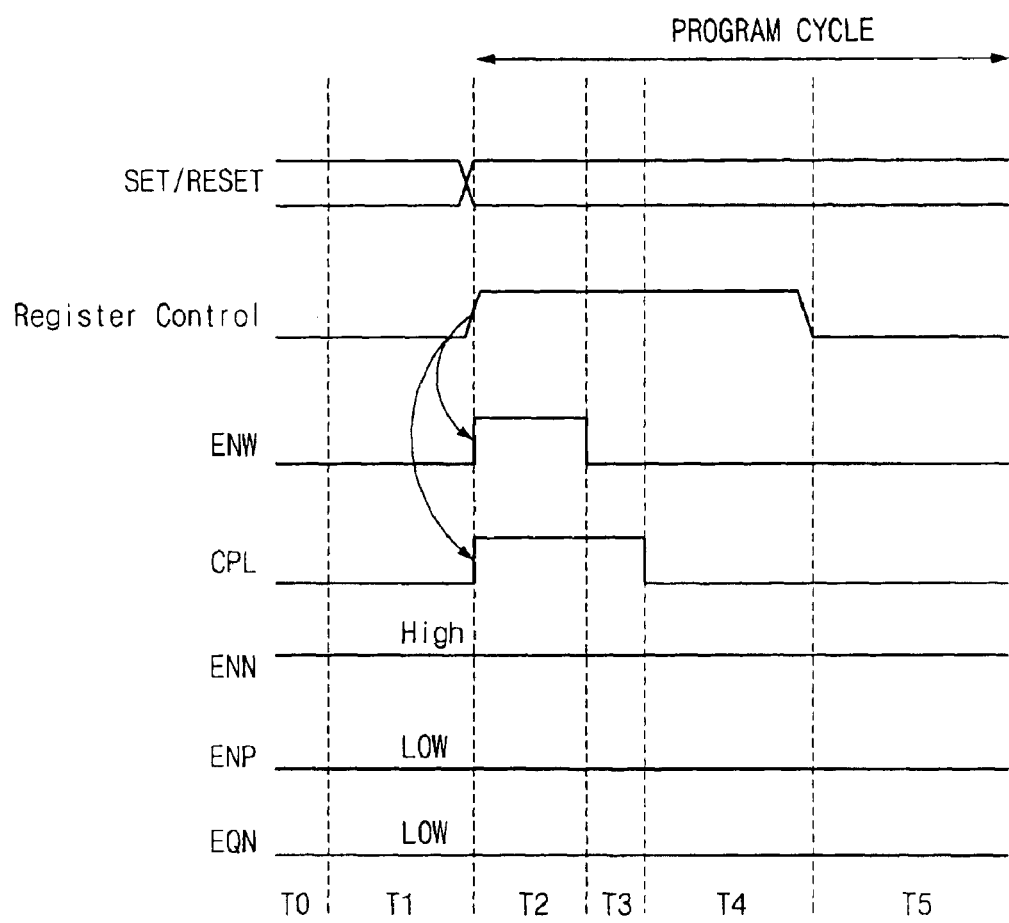
FIG. 20a is a timing diagram illustrating the write operation of the register of FIG. 19.

FIG. 20a is a timing diagram illustrating the write operation of the register 500 of FIG. 19.

In an interval t2, if a program cycle starts, a register control signal is activated. Then, the control signal ENW is activated, the data signal SET/RESET is outputted into the first node and the second node. If the control signal CPL becomes "high", a signal is stored in the ferroelectric capacitors FC1, FC2, FC3 and FC4 depending on voltages of the first node and the second node. For example, if the first node is "low" and the second node is "high", charges of data are stored in the ferroelectric capacitors FC1 and FC4.

In an interval t3, if the control signal ENW becomes "low", the data signal SET/RESET is separated from the first node and the second node. The voltage difference between the first node and the second node are amplified by the first amplifier 510 and the second amplifier 540.

In an interval t4, if the control signal CPL becomes "low", the charges are re-distributed among the ferroelectric capacitors FC1 to FC4. Here, the voltage of the second node becomes higher than that of the first node. The ferroelectric capacitors FC1~FC4 maintain the charges even when power is off.

Figure 20B:
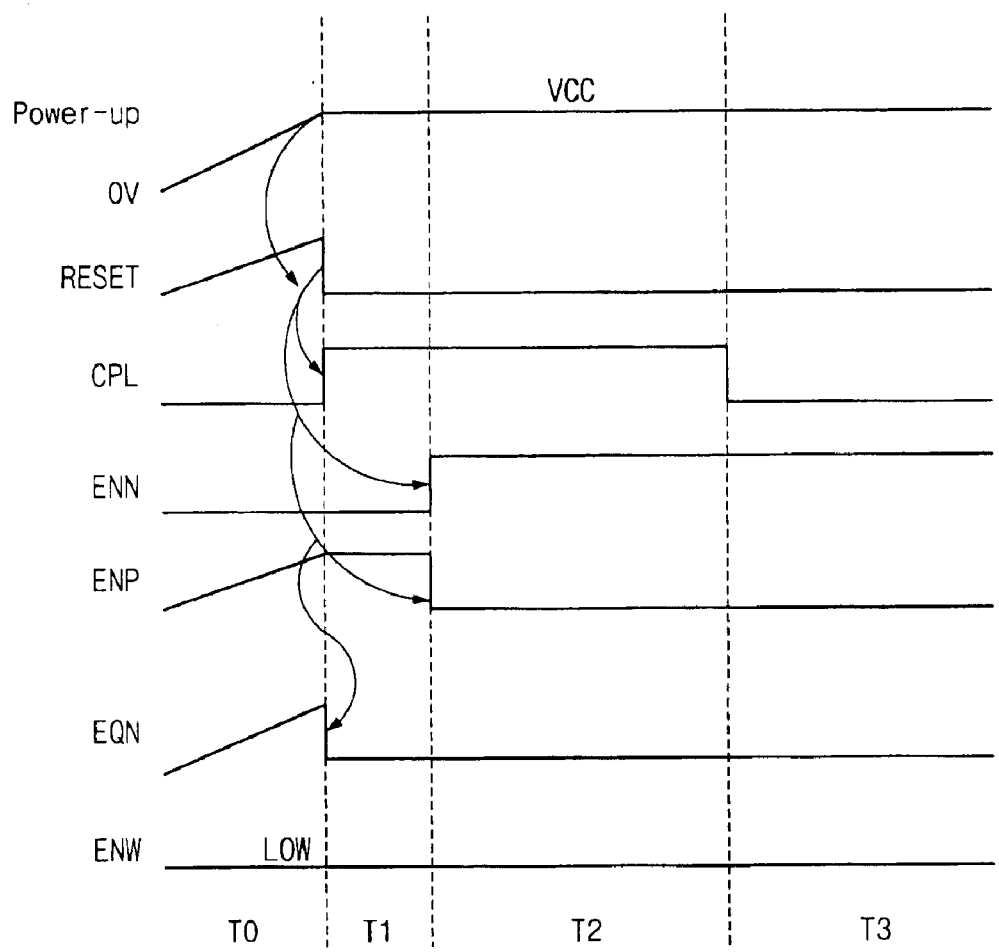
FIG. 20b is a timing diagram illustrating the read operation of the register of FIG. 19.

FIG. 20b is a timing diagram illustrating the read operation of the register of FIG. 19.

In an interval t1, if power reaches a stable level, the reset signal RESET is generated. When the control signal CPL becomes "low" in response to the reset signal RESET, a voltage difference is generated between the first node and the second node by the charges stored in the ferroelectric capacitors FC1~FC4. Here, the voltage of the second node is higher than that of the first node.

In an interval t2, when the control signal ENN becomes "high" and the control signal ENP becomes "low", the first amplifier 510 and the second amplifier 540 are activated to amplify the voltages of the first node and the second node. Here, the first node is fixed at the "low" level, and the second node is fixed at the "high" level.

In an interval t3, when the control signal CPL becomes "low", the original data stored in the ferroelectric capacitors FC1~FC4 are restored.

Figure 21:
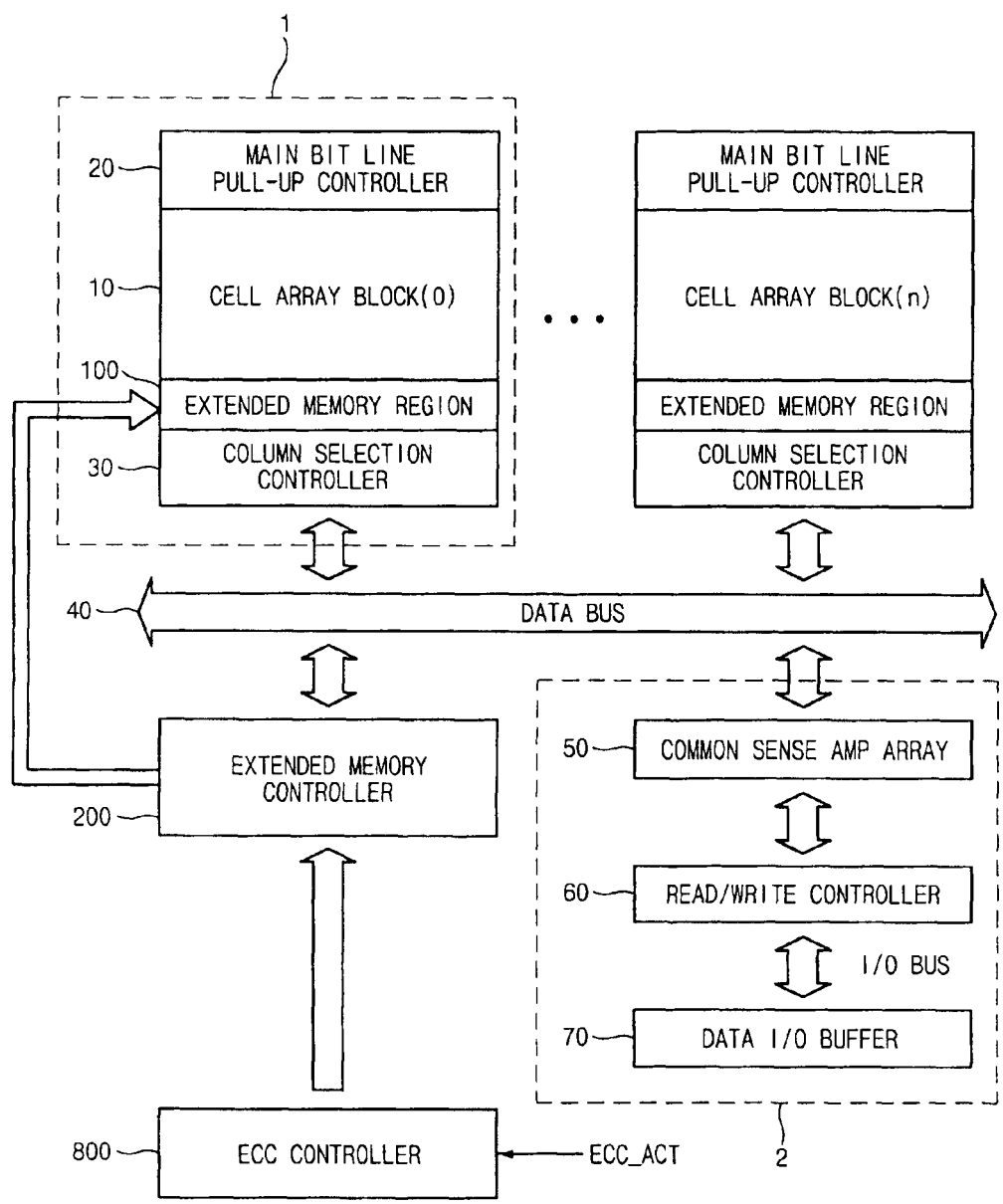
FIG. 21 is a block diagram illustrating a ferroelectric memory device including an extended memory unit according to another embodiment of the present invention.

FIG. 21 is a block diagram illustrating a ferroelectric memory device including an extended memory unit according to another embodiment of the present invention. In this embodiment, the ferroelectric memory device further comprises an ECC controller 800.

When a fail cell occurs in the memory device applied to a system, the ECC controller 800 controls the extended memory controller 200 to write information of the fail cell and a redundancy cell in the extended memory unit 100. As a result, the extended memory unit 100 is used to perform a repair operation on the fail cell.

The redundancy operation performed in the redundancy cell region 130 is to replace the fail cell, which is identified during a memory device test with a spare cell in the redundancy cell region 130 when an address corresponding to the fail cell is inputted. An additional repair means is required to perform a repair operation on the fail cell, which is identified while the memory device is applied to a system. The additional repair means is the ECC controller 800. The ECC controller 800 is disposed in the memory device and performs the repair operation on the fail cell in cooperation with the extended memory controller 200 and the extended memory unit 100.

Figure 22:
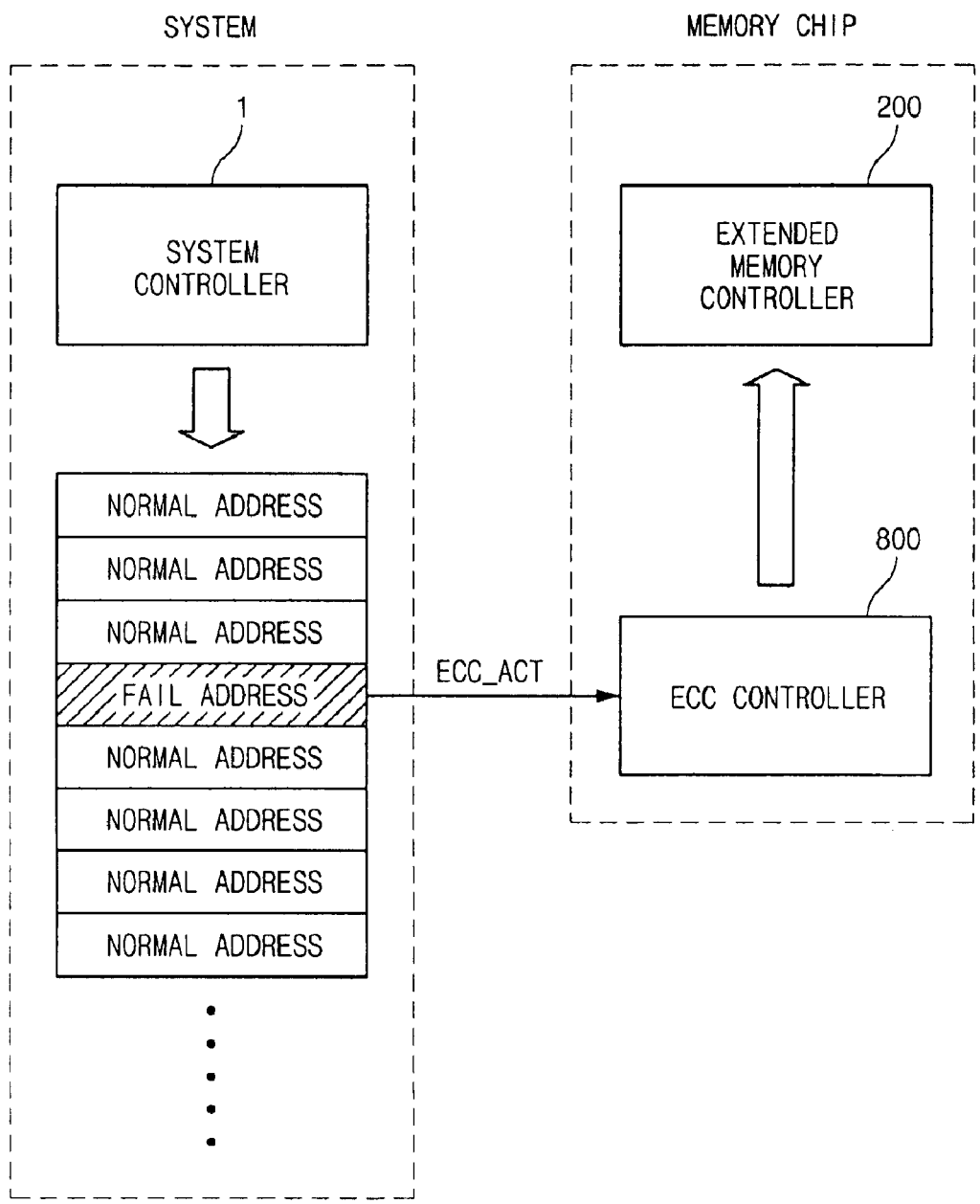
FIG. 22 is a block diagram illustrating the operation of an ECC controller and an external system.

FIG. 22 is a block diagram illustrating the operation of the ECC controller 800 of FIG. 21. The ECC controller 800 receives a control signal ECC_ACT from a system. A system controller tests the memory device to detect the state of cell arrays. If a fail cell is found, an address of the fail cell is memorized. When the fail cell is accessed, the control signal ECC_ACT is activated. If the control signal ECC_ACT is activated, the ECC controller 800 is activated. As a result, a corresponding cell of the extended memory unit 100 is allowed to be accessed instead of the fail cell.

Figure 23:
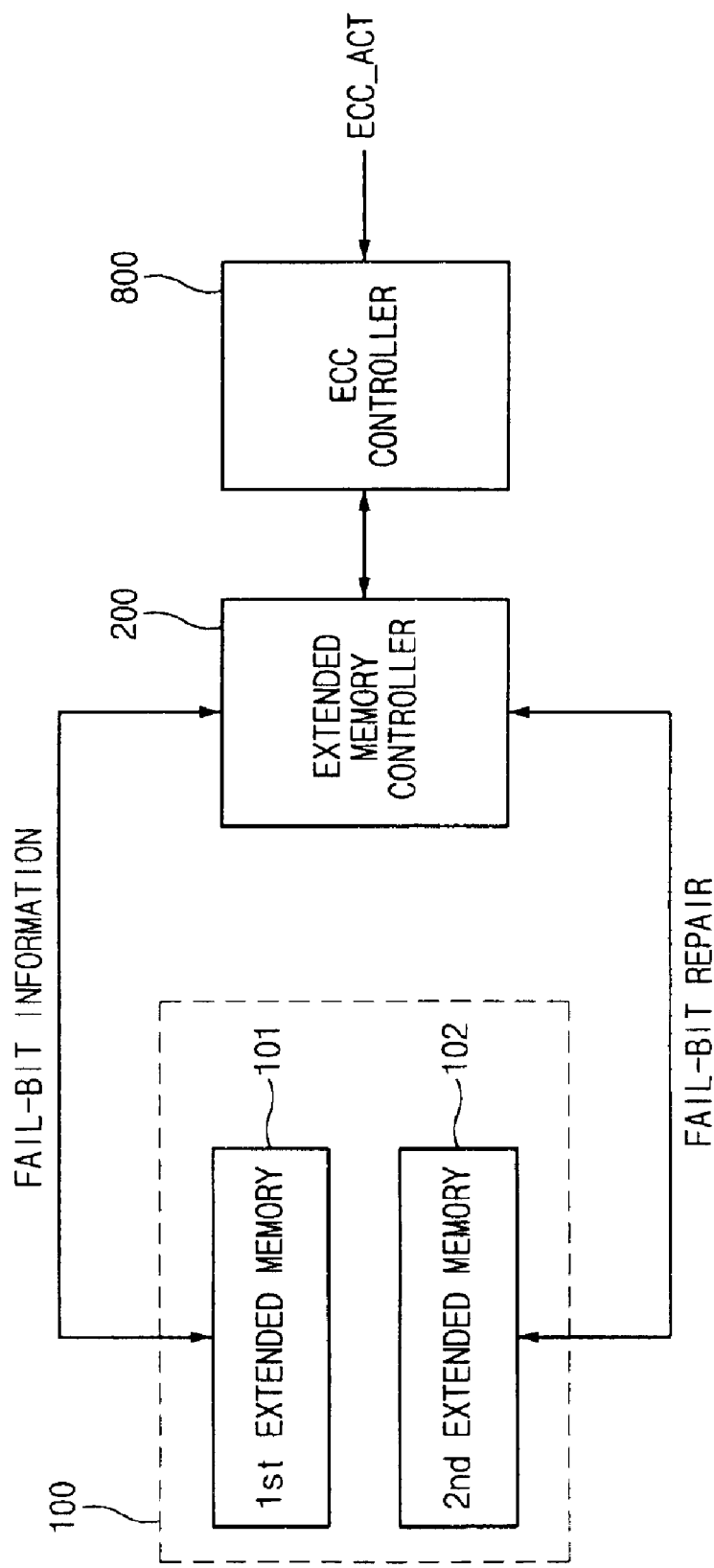
FIG. 23 is a block diagram illustrating a structure of a memory chip region of FIG. 22.

FIG. 23 is a block diagram illustrating the structure of the extended memory unit 100 of FIG. 21.

The extended memory unit 100 comprises a first extended memory unit 101 and a second extended memory unit 102. The second extended memory unit 102 includes spare cells to replace fail cells. The first extended memory unit 101 includes cells to store addresses of fail cells and spare cells.

Figure 24:
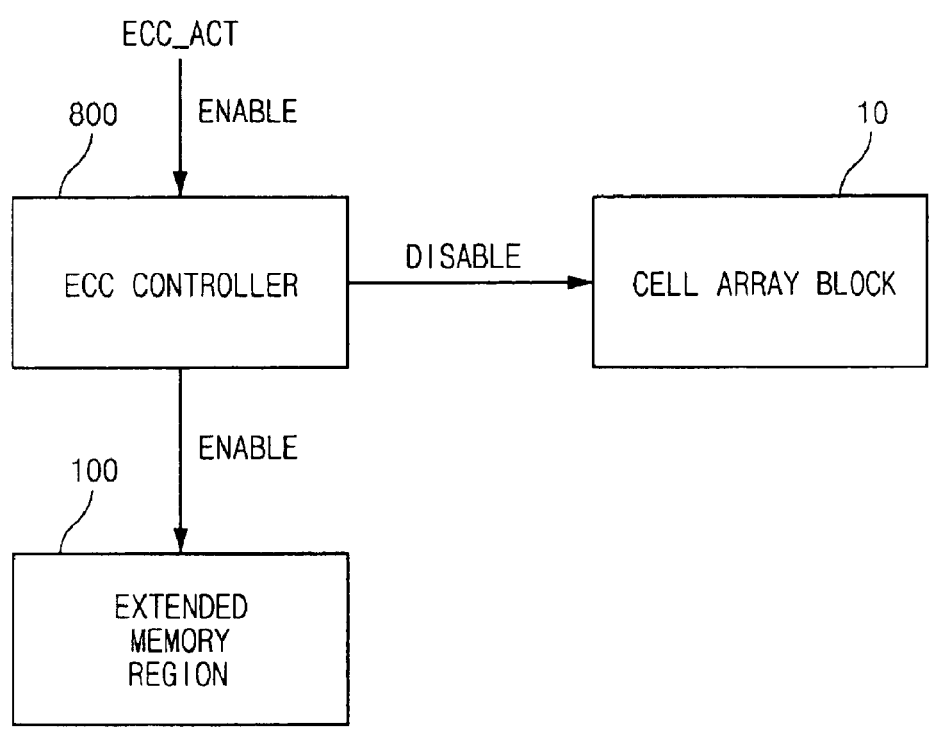
FIG. 24 is a block diagram illustrating a function of the ECC controller of FIG. 21.

FIG. 24 is a block diagram illustrating the operation of the ECC controller 800 of FIG. 21 when a fail cell is repaired. If the control signal ECC_ACT is activated, the ECC controller 800 obtains an address of a spare cell corresponding to an address of an inputted fail cell referring to the first extended memory unit 101. Then, the ECC controller 800 inactivates the cell array block 10 including the fail cell, and activates the second extended memory unit 102 including the spare cell. As a result, the redundancy operation can be performed on the fail cell.

According to an embodiment of the present invention, additional information such as hardware information, security information can be written in an extended memory unit included in a memory device. The extended memory unit can share most control circuits because it has the same structure as that of a normal cell array. Therefore, the extended memory unit can be added without increasing the size of a chip so much.

Additionally, since an ECC controller built in the memory device is closely connected with the extended memory unit, a fail cell identified during the operation can be repaired through the redundancy operation.

What is claimed is:

1. A ferroelectric memory device including an extended memory unit, comprising:

a cell array block including a main bitline and a plurlaity of sub bitlines, the main bitline connected between a main bitline pull-up controller and a column selection controller, and each sub bitline connected to the main bitline and a unit cell;

a data bus unit connected to the column selection controller;

an input/output circuit unit including a sense amplifier array connected to the data bus unit;

an extended memory unit sharing the main bitline included in the cell array block and including a plurality of cell blocks; and an extended memory controller for controlling the extended memory unit in response to an external control signal.

2. The device according to claim 1, wherein the main bitline pull-up controller is a PMOS transistor having a gate to receive a control signal, a source connected to a positive power and a drain connected to the main bitline.

3. The device according to claim 1, wherein the column selection controller is a switch having a gate to receive a control signal, a terminal connected to a main bitline and the other terminal connected to a data bus line.

4. The device according to claim 1, wherein the cell array block includes a plurality of sub cell blocks corresponding to the plurality of sub bitlines respectively, each sub cell block comprising:
- a first NMOS transistor having a gate connected to a first terminal of the sub bitline and a drain connected to the main bitline;
- a second NMOS transistor having a gate connected to a third control signal, a drain connected to a source of the first NMOS transistor and a grounded source;
- a third NMOS transistor having a gate connected to a fourth control signal, a drain connected to a second terminal of the sub bitline and a grounded source;
- a fourth NMOS transistor having a gate connected to a fifth control signal, a source connected to the second terminal of the sub bitline and a dram connected to a sixth control signal; and
- a fifth NMOS transistor having a gate connected to a seventh control signal, a drain connected to the main bitline and a source connected to the second terminal fo the sub bitline.

5. The device according to claim 4, wherein the cell block included in the extended memory unit has the same structure as that of the sub cell block.

6. The device according to claim 5, wherein a part of the cell block is used as a redundancy cell region and the rest part of the cell block is used as an extended cell region.

7. The device according to claim 6, further comprising:
- a redundancy decoder for driving a wordline/plateline included in the redundancy cell region when the redundancy cell region is accessed;
- an extended memory decoder for driving a wordline/plateline includded in the extended cell region when the extended cell region is accessed; and
- a sub bitline controller for outputting a plurality of control signals corresponding to the first to the seventh control signals commonly used in the sub cell block and the cell block.

8. The device according to claim 4, wherein the extended memory unit comprises a cell block having the same structure as that of the sub cell block,
- wherein the cell block comprises smaller number of unit cells than those of the sub cell block, and a capacitor for compensating for difference in capacitance resulting from difference in the number of the unit cells, and
- wherein the capacitor is connected between a sub bitline included in the cell block and ground.

9. The device according to claim 8, wherein the extended memory unit uses a part of the unit cell in the cell block as the redundancy cell region, and the rest part of the unit cell as the extended cell region.

10. The device according to claim 9, further comprising:
- a redundancy decoder for driving a wordline/plateline included in the redundancy cell region only when the redundancy cell region is accessed;
- an extended memory decoder for driving a wordline/plateline included in the extended cell region only when the extended cell region is accessed; and
- a sub bitline controller for outputting a plurality of control signals corresponding to the first to the seventh control signals commonly used in the sub cell block and in the cell block.

11. A ferroelectric memory device including an extended memory unit, comprising:
- a controller for storing a predetermined key value in response to an external command signal, for outputting an extended memory control signal corresponding to the external control signal when the external control signal satisfies a predetermined condition of the key value, and for maintaining the stored key value when power is off; and
- an extended memory unit including a plurality of cells for storing predetermined data in response to the extended memory control signal, the plurality of cells sharing existing bitlines.

12. The device according to claim 11, wherein the controller comprises:
- a program command decoder for decoding the external command signal and outputting a program command signal;
- a power-up circuit for outputting a reset signal which is inactivated after power is turned on and stabilized;
- a register controller for outputting a register control signal to control the program process when the program command signal is activated and to control the process of reading the program result when the reset signal is inactivated;
- a register for storing a key value corresponding to a data signal supplied externally in response to the register control signal, for outputting the stored key value externally, and for maintaining the stored key value when power is off; and
- an extended memory controller for controlling the extended memory unit in response to a key value outputted from the register and an external control signal.

13. The device according to claim 12, wherein the register comprises:
- a first amplifier for amplifying a voltage of a node having higher voltage between first and second nodes to a positive voltage in response to a first control signal;
- a second amplifier for amplifying a voltage of a node having lower voltage between the first and the second nodes to a ground voltage in response to a second control signal;
- an input unit for outputting a data signal into the first and the second nodes in response to a third control signal; and
- a storage unit for storing the signal outputted into the first and the second nodes in response to a fourth control signal and for maintaining the stored information when power is off.

14. The device according to claim 13, wherein the first amplifier comprises:
- a first PMOS transistor having a gate to receive the first control signal and a source connected to a positive power;
- a second PMOS transistor having a gate connected to the first node, a source connected to a drain of the first PMOS transistor and a drain connected to the second node; and
- a third PMOS transistor having a gate connected to the second node, a source connected to the drain of the first PMOS transistor and a drain connected to the first node.

15. The device according to claim 13, wherein the second amplifier comprises:
- a first NMOS transistor having a gate connected to the first node and a drain connected to the second node;
- a second NMOS transistor having a gate connected to the second node and a drain connected to the first node; and a third NMOS transistor having a gate to receive the second control signal, a drain connected to sources of the first NMOS transistor and the second NMOS transistor, and a source connected to ground.

16. The device according to claim 13, wherein the input unit comprises:

a first PMOS transistor having a gate to receive a NAND operation result of the data signal and the third control signal, a source connected to a positive power and a drain connected to the second node;

a first NMOS transistor having a gate to receive an AND operation result of the data signal and the third control signal, a source connected to ground and a drain connected to the first node;

a second NMQS transistor having a gate to receive an AND operation result of a signal having an opposite level to the data signal and the third control signal, a source connected to ground and a drain connected to the second node; and a second PMOS transistor having a gate to receive a NAND operation result of a signal having an opposite level to the data signal and the third control signal, a source connected to a positive power and a drain connected to the first node.

17. The device according to claim 13, wherein the storage unit comprises:

a first ferroelectric capacitor having a first terminal to receive the fourth control signal and a second terminal connected to the first node;

a second ferroelectric capacitor having a first terminal to receive the fourth control signal and a second terminal connected to the second node;

a third ferroelectric capacitor having a first terminal connected to the first node and a second terminal connected to ground; and a fourth ferroelectric capacitor having a first terminal connected to the second node and a second terminal connected to ground.

18. A ferroelectric memory device including an extended memory unit, comprising:

an ECC controller for outputting an extended memory control signal in response to a repair request signal activated when a fail cell is accessed, and for inactivating the fail cell;

an extended memory unit including a redundancy cell for replacing the fail cell; and an extended memory controller for controlling the extended memory unit in response to the extended memory control signal, wherein the repair request signal is generated by an outer system when the failed cell is about to be accessed by the outer system.

19. The device according to claim 18, wherein the extended memory unit comprises:

a first extended memory unit for storing an address of the fail cell and an address of the redundancy cell corresponding to the fail cell; and a second extended memory unit including the redundancy cell, wherein the extended memory controller controls the redundancy cell using the address of the redundancy cell obtained from the first extended memory unit.

* * * * *